United States Patent
Kim et al.

(10) Patent No.: US 9,466,537 B2
(45) Date of Patent: Oct. 11, 2016

(54) METHOD OF INSPECTING SEMICONDUCTOR DEVICE AND METHOD OF FABRICATING SEMICONDUCTOR DEVICE USING THE SAME

(71) Applicant: SAMSUNG ELECTRONICS CO., LTD., Suwon-si, Gyeonggi-do (KR)

(72) Inventors: Minkook Kim, Goyang-si (KR); Wooseok Ko, Seoul (KR); Yusin Yang, Seoul (KR); Sangkil Lee, Yongin-si (KR); Chungsam Jun, Suwon-si (KR)

(73) Assignee: SAMSUNG ELECTRONICS CO., LTD., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/988,991

(22) Filed: Jan. 6, 2016

(65) Prior Publication Data

US 2016/0204041 A1    Jul. 14, 2016

(30) Foreign Application Priority Data

Jan. 9, 2015 (KR) .................. 10-2015-0003362

(51) Int. Cl.
*H01L 21/00* (2006.01)
*H01L 21/66* (2006.01)

(52) U.S. Cl.
CPC .................... *H01L 22/12* (2013.01)

(58) Field of Classification Search
CPC .................................................. H01L 22/12
See application file for complete search history.

(56) References Cited

U.S. PATENT DOCUMENTS

| | | | |
|---|---|---|---|
| 5,371,582 A * | 12/1994 | Toba | G01B 11/22 356/626 |
| 5,798,529 A | 8/1998 | Wagner | |
| 6,031,229 A | 2/2000 | Keckley et al. | |
| 7,164,128 B2 | 1/2007 | Miyamoto et al. | |
| 7,216,311 B2 | 5/2007 | Tanaka et al. | |
| 7,335,881 B2 | 2/2008 | Tanaka et al. | |
| 7,459,712 B2 | 12/2008 | Tanaka et al. | |
| 7,897,918 B2 | 3/2011 | Phaneuf et al. | |
| 7,972,440 B2 | 7/2011 | Houge et al. | |
| 8,110,898 B2 | 2/2012 | Lewis et al. | |
| 8,357,922 B2 | 1/2013 | Hong et al. | |
| 8,557,612 B2 | 10/2013 | Henry et al. | |
| 8,624,185 B2 | 1/2014 | Maas et al. | |
| 8,759,802 B2 | 6/2014 | Tanner | |
| 8,890,064 B2 | 11/2014 | Arjavac et al. | |
| 2002/0057537 A1* | 5/2002 | Rejda | G11B 5/3163 360/313 |
| 2013/0186747 A1 | 7/2013 | Schmidt et al. | |
| 2013/0319849 A1 | 12/2013 | Fuller et al. | |

FOREIGN PATENT DOCUMENTS

| | | |
|---|---|---|
| JP | 2004-247394 A | 9/2004 |
| JP | 2005-189137 A | 7/2005 |
| JP | 2010-092869 A | 4/2010 |
| KR | 10-2009-0085478 A | 8/2009 |

* cited by examiner

*Primary Examiner* — Richard Booth
(74) *Attorney, Agent, or Firm* — Lee & Morse P.C.

(57) ABSTRACT

A method of inspecting a semiconductor device includes providing a substrate, on which a mold layer with a plurality of mold openings is provided, milling the mold layer in a direction inclined at a predetermined angle with respect to a direction normal to a top surface of the substrate, such that an inclined cutting surface exposing milled mold openings is formed, the milled mold openings including first milling openings along a first column extending in a first direction and having different heights, obtaining image data of the cutting surface, the image data including first contour images of the first milling openings, and obtaining a first process parameter, which represents an extent of bending of the mold openings according to a distance from a top surface of the substrate, using positions of center points of the first contour images.

20 Claims, 35 Drawing Sheets

<Low-Magnification Image>

Relative Position of Center Point

<Low-Magnification Image>

<Low-Magnification Image>

METHOD OF INSPECTING SEMICONDUCTOR DEVICE AND METHOD OF FABRICATING SEMICONDUCTOR DEVICE USING THE SAME

CROSS-REFERENCE TO RELATED APPLICATION

Korean Patent Application No. 10-2015-0003362, filed on Jan. 9, 2015, in the Korean Intellectual Property Office, and entitled: "Method of Inspecting Semiconductor Device and Method of Fabricating Semiconductor Device Using the Same," is incorporated by reference herein in its entirety.

BACKGROUND

1. Field

Example embodiments relate to a method of inspecting a semiconductor device and a method of fabricating a semiconductor device using the same.

2. Description of the Related Art

Due to their small-size, multi-functionality, and/or low-cost characteristics, semiconductor devices are being esteemed as important elements in the electronic industry. The semiconductor devices may be fabricated using several processes, e.g., photolithography, etching, deposition, ion-implantation, and cleaning processes.

An inspection process is performed to examine whether there is any failure in patterns constituting a fabricated semiconductor device, when the fabrication of the semiconductor device is finished. By performing the inspection process, it is possible to optimize a process condition of the fabrication process and know whether there is any failure in a semiconductor device at an early stage. As the semiconductor device is scaled down, there is an increasing demand for a method and a system capable of reliably measuring fine patterns in the semiconductor device.

SUMMARY

Example embodiments provide a highly-reliable inspection method applicable to a semiconductor device.

Other example embodiments provide a method of fabricating a semiconductor device with improved reliability.

According to example embodiments, a method of inspecting a semiconductor device includes providing a substrate, on which a mold layer with a plurality of mold openings is provided, milling the mold layer in a direction inclined at a predetermined angle with respect to a direction normal to a top surface of the substrate, such that an inclined cutting surface exposing milled mold openings is formed, the milled mold openings including first milling openings along a first column extending in a first direction and having different heights, obtaining image data of the cutting surface, the image data including first contour images of the first milling openings, and obtaining a first process parameter, which represents an extent of bending of the mold openings according to a distance from a top surface of the substrate, using positions of center points of the first contour images.

In example embodiments, the obtaining of the first process parameter may include obtaining positions of the center points of the first contour images, establishing one of the first contour images as a reference contour image, and obtaining relative position values between the center points of the reference contour image and the first contour images.

In example embodiments, the obtaining of the relative position values between the center points may include obtaining differences between x coordinates of the center points of the reference contour image and the first contour images in an x-y coordinate system, and the first process parameter may be given by a distribution of the differences according to the distance from the top surface of the substrate.

In example embodiments, the cutting surface may include a first edge and a second edge, which are opposite to and spaced laterally apart from each other and are adjacent to top and bottom surfaces, respectively, of the mold layer. The reference contour image may correspond to a contour image of one of the first milling openings, which is positioned most adjacent to the first edge.

In example embodiments, the milled mold openings further includes second milling openings constituting a second column parallel to the first direction and having different heights, the image data further includes second contour images that may be contour images of the second milling openings, and the obtaining of the first process parameter further includes using positions of center points of the second contour images.

In example embodiments, the cutting surface may include a first edge and a second edge, which are opposite to and spaced laterally apart from each other and are adjacent to top and bottom surfaces, respectively, of the mold layer. The first direction may be directed from the first edge to the second edge, when viewed in plan view.

In example embodiments, the second milling openings may be spaced apart from the first milling openings in a second direction crossing the first direction, and the first and second milling openings may be arranged in a zigzag manner in the first direction, when viewed in plan view.

In example embodiments, the method may further include obtaining a second process parameter, which represents dispersion in section shapes of the mold openings according to the distance from the top surface of the substrate, using contour lines of the first contour images.

In example embodiments, the obtaining of the second process parameter may include obtaining at least one of a first sub process parameter representing an extent of striation of the mold openings according to heights of the mold openings, a second sub process parameter representing an extent of bowing of the mold openings according to heights of the mold openings, or a third sub process parameter representing an extent of distortion of the mold openings according to heights of the mold openings.

In example embodiments, the obtaining of the first sub process parameter may include specifying the contour line of each of the first contour images, obtaining a comparative line from the contour line of each of the first contour images, and obtaining differences between the contour and comparative lines of each of the first contour images.

In example embodiments, the comparative line may be obtained by an ellipse fitting method.

In example embodiments, the obtaining of the second sub process parameter may include specifying the contour line of each of the first contour images, obtaining a comparative line from the contour line of each of the first contour images, and obtaining a longitudinal or traversal length of the comparative line of each of the first contour images.

In example embodiments, the obtaining of the third sub process parameter may include calculating a difference or ratio between the longitudinal and traversal lengths.

In example embodiments, the obtaining of the image data of the cutting surface may include obtaining a low-magnification image of the cutting surface and obtaining a high-magnification image of the cutting surface. Here, the first process parameter may be obtained using the low-magnification image of the cutting surface, and the second process parameter may be obtained using the high-magnification image of the cutting surface.

In example embodiments, the mold layer may be a layer stack including first and second layers, which are alternately and repeatedly stacked one on top of the other and are formed of materials with an etch selectivity with respect to each other.

In example embodiments, the mold openings may be formed to have an aspect ratio ranging from 1:5 to 1:100.

According to example embodiments, a method of inspecting a semiconductor device may include providing a substrate, on which a mold layer with a plurality of mold openings are provided, milling the mold layer in a direction, which is inclined at a specific angle to a direction normal to a top surface of the substrate, to form an inclined cutting surface exposing the mold openings milled by the milling, the milled mold openings including first milling openings constituting a column parallel to a specific direction and having different heights, obtaining image data of the cutting surface, the image data including first contour images that are contour images of the first milling openings, and obtaining process parameters containing information on three-dimensional structures of the mold openings using the first contour images.

In example embodiments, the obtaining of the process parameters may include obtaining a first process parameter representing an extent of bending of the mold openings according to a distance from the top surface of the substrate, and obtaining a second process parameter representing dispersion in section shapes of the mold openings according to the distance from the top surface of the substrate.

In example embodiments, the obtaining of the first process parameter may include using relative positions of center points of the first contour images, and the obtaining of the second process parameter may include specifying a contour line of each of the first contour images, obtaining a comparative line from the contour line of each of the first contour images, and measuring a dimension of the contour line or the comparative line.

According to example embodiments, a method of fabricating a semiconductor device may include forming a mold layer on a substrate, the mold layer including sacrificial layers and insulating layers alternately and repeatedly stacked one on top of the other, forming a plurality of channel holes to penetrate the mold layer and expose the substrate, performing a first measurement on a resulting structure with the channel holes, forming channel structures in the channel holes, forming trenches to penetrate the mold layer and expose the sacrificial layers and insulating layers, the trenches being formed spaced apart from the channel structures, and replacing the sacrificial layers with gate electrodes. The first measurement may include milling a portion of the mold layer in a direction, which is inclined at a specific angle to a direction normal to a top surface of the substrate, to form an inclined cutting surface exposing the channel holes milled by the milling, the milled channel holes including first milling channel holes constituting a column and having different heights, obtaining image data of the cutting surface, the image data including first contour images that may be contour images of the first milling channel holes, and obtaining process parameters containing information on three-dimensional structures of the channel holes using the first contour images.

According to example embodiments, a method of fabricating a semiconductor device may include providing a substrate, the substrate including a mold layer thereon with a plurality of mold openings spaced apart from each other along a first direction, milling the mold layer in a direction obliquely inclined with respect to a direction normal to a top surface of the substrate, such that an inclined cutting surface exposing milled mold openings is formed, obtaining image data of the cutting surface, the image data including first contour images of the first milling openings, and obtaining a first process parameter using positions of center points of the first contour images, the first process parameter representing an extent of bending of the mold openings according to a distance from a top surface of the substrate.

Milling the mold layer may include milling an entire top surface of the mold layer including the plurality of mold openings.

Milling the mold layer may include milling the mold layer such that the plurality of milled mold openings along the first direction have different heights.

Obtaining the first process parameter may include comparing the positions of center points of the first contour images of milled openings adjacent to each other along the first direction.

The method may further include comparing a contour line of each of the first contour images to a reference contour line.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
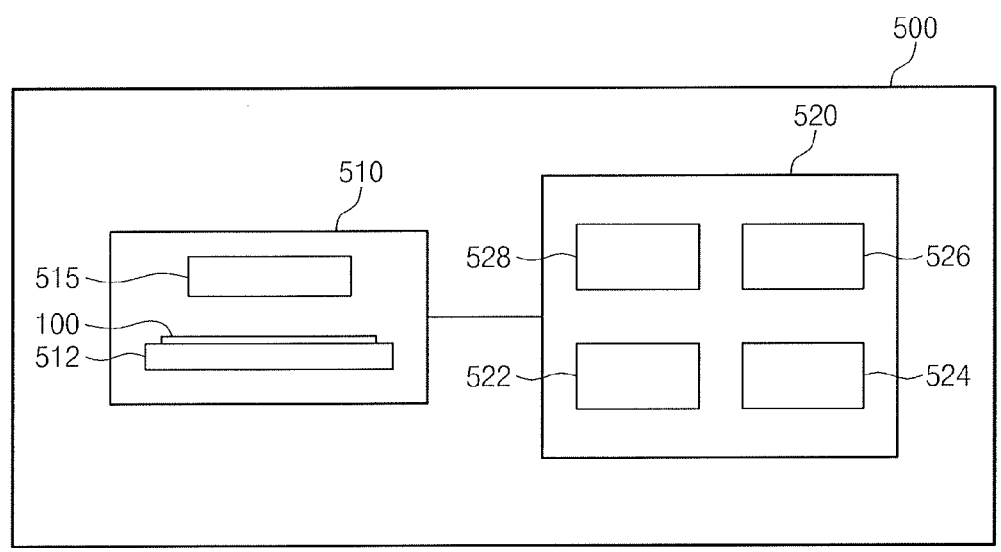
FIG. 1 illustrates a block diagram of a semiconductor inspection system according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout. Other words used to describe the relationship between elements or layers should be interpreted in a like fashion (e.g., "adjacent" versus "directly adjacent").

As used herein the term "and/or" includes any and all combinations of one or more of the associated listed items. It will also be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

As appreciated, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
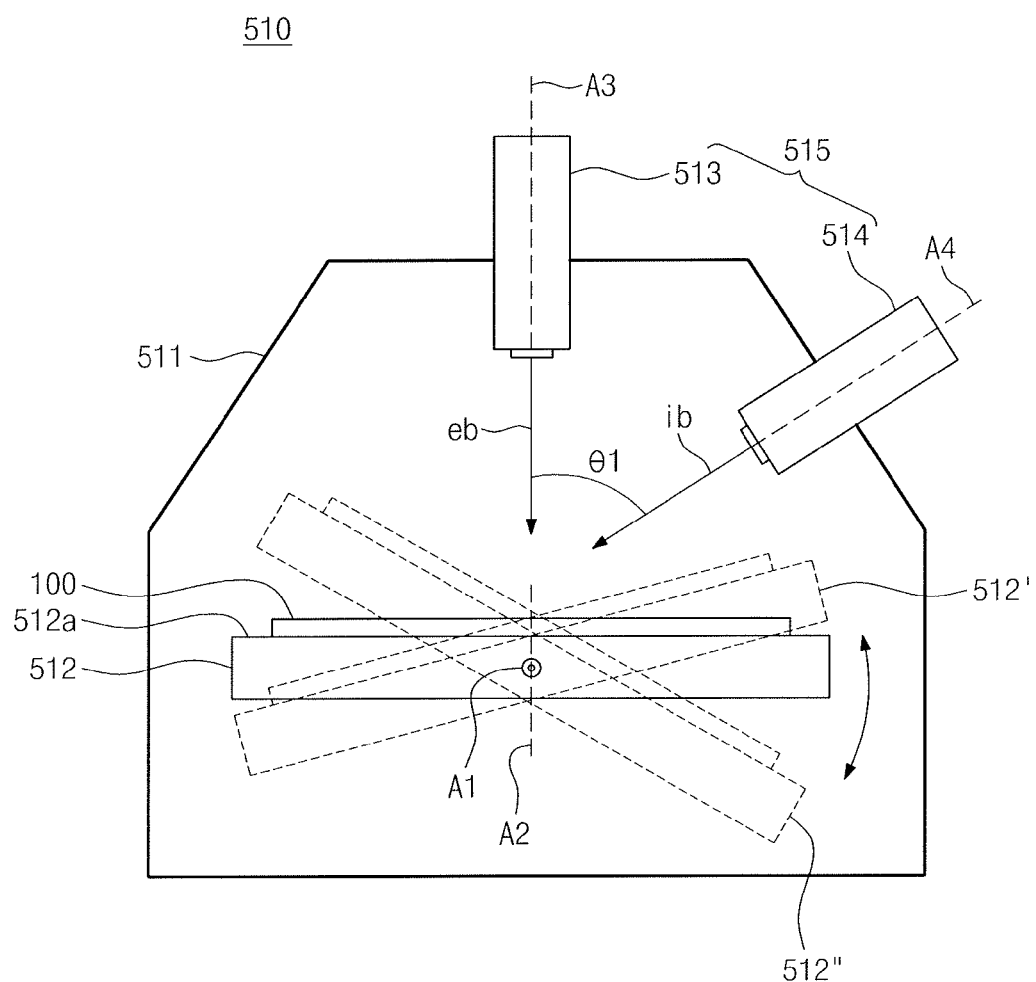
FIG. 2 illustrates a schematic diagram of a semiconductor test apparatus of FIG. 1.

FIG. 1 is a block diagram illustrating a semiconductor inspection system according to example embodiments. FIG. 2 is a diagram schematically illustrating a semiconductor test apparatus of FIG. 1.

Referring to FIGS. 1 and 2, a semiconductor inspection system 500 according to example embodiments may include a semiconductor test apparatus 510 and a computer system 520. The semiconductor test apparatus 510 may include a vacuum chamber 511, a stage 512, which is installed in the vacuum chamber 511 and is used to load a substrate 100, and a measurement unit 515, which is configured to perform a test on the substrate 100.

In example embodiments, the stage 512 may be configured in such a way that it can be rotated about a first rotating axis A1 (into the page of FIG. 2) parallel to a top surface 512a thereof and about a second rotating axis A2 perpendicular to the first rotating axis A1. For example, the stage 512 may be rotated about the first rotating axis A1, as exemplarily illustrated by the reference numerals 512' or 512". Further, the stage 512 may be moved along two orthogonal directions defining a plane or on the plane. A plurality and a variety of patterns constituting a semiconductor device may be provided on the substrate 100. Such patterns may be three-dimensional structures, e.g., holes, grooves, trenches, and/or line-and-space patterns.

In example embodiments, the measurement unit 515 may include an image measurement unit 513 and an ion beam milling unit 514. The ion beam milling unit 514 may be configured to perform a milling process, in which a focused ion beam "ib" is used to form a cutting surface at a position of patterns in target, on the substrate 100. The image measurement unit 513 may be configured to perform an imaging operation of irradiating an electron beam "eb" onto the cutting surface to obtain image data of the cutting surface. The image measurement unit 513 and the ion beam milling unit 514 may be installed over, e.g., above, the stage 512, in the vacuum chamber 511. In example embodiments, the ion beam milling unit 514 and the image measurement unit 513 may be disposed spaced apart from the stage 512 in a vertical direction and may be arranged at an angle to each other. As an example, an axis A4 of the ion beam milling unit 514 may be inclined at a first angle $\theta 1$ with respect to an axis A3 of the image measurement unit, where $\theta 1$ is an acute angle. The image measurement unit 513 and the ion beam milling unit 514 may be, e.g., a scanning electron microscope (SEM) and a focused ion beam (FIB) system, respectively.

The computer system 520 may include a controller 522 for processing data and a memory device 524 for storing data. The controller 522 may calculate process monitoring data from the image data obtained by the semiconductor test apparatus 510. Such calculation may be performed using specific algorithms designed to obtain a desired process monitoring data.

The memory device 524 may include a non-volatile data-storage medium. For example, the memory device 524 may include a hard disk drive and/or a non-volatile semiconductor memory device, e.g., FLASH memory devices, phase-changeable memory devices, and/or magnetic memory devices. The memory device 524 may store the image data obtained by the semiconductor test apparatus 510 and data processed in the computer system 520.

In addition, the computer system 520 may further include an input/output unit 526 and an interface unit 528. The input/output unit 526 may include at least one of, e.g., a keyboard, a keypad, and/or a display device. The image data obtained by the semiconductor test apparatus 510 may be transferred to the computer system 520 through the interface unit 528. Also, the data processed in the computer system 520 may be transferred to the semiconductor test apparatus 510 or any external device, e.g., a data server or an APC server, through the interface unit 528. The interface unit 528 may include a wired element, a wireless element, a universal serial bus (USB) port, and so forth. The controller 522, the memory device 524, the input/output unit 526, and the interface unit 528 may be coupled to each other via at least one data bus.

The semiconductor inspection system 500 may be used to perform an inspection process on a semiconductor device. Hereinafter, such an inspection method according to example embodiments will be described.

Figure 3:
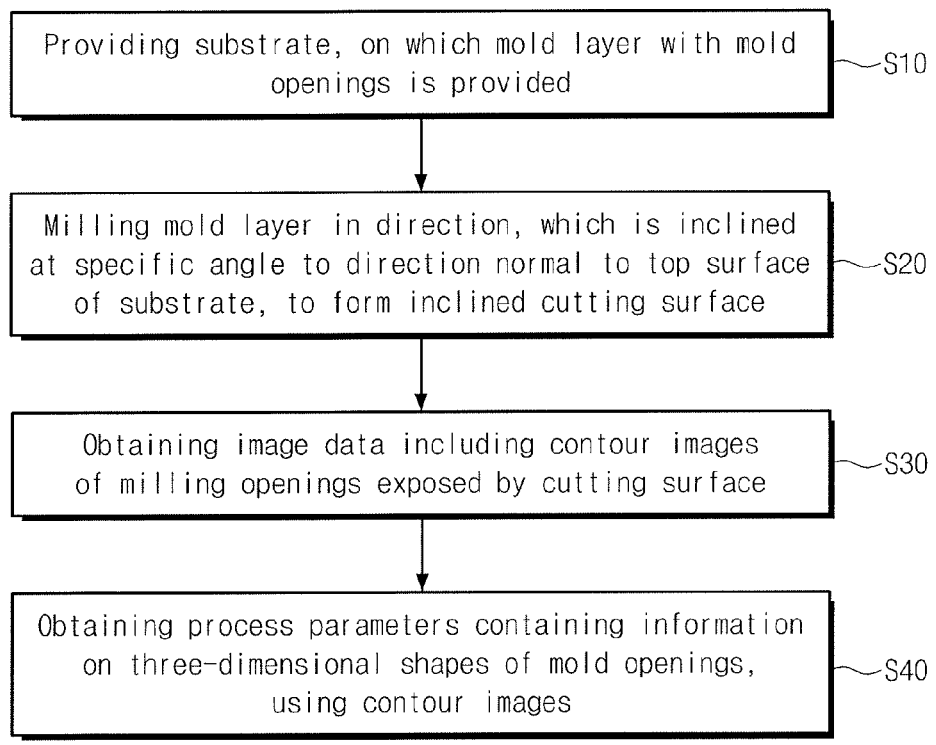
FIG. 3 illustrates a flow chart of a method of inspecting a semiconductor device according to example embodiments.
Figure 4:
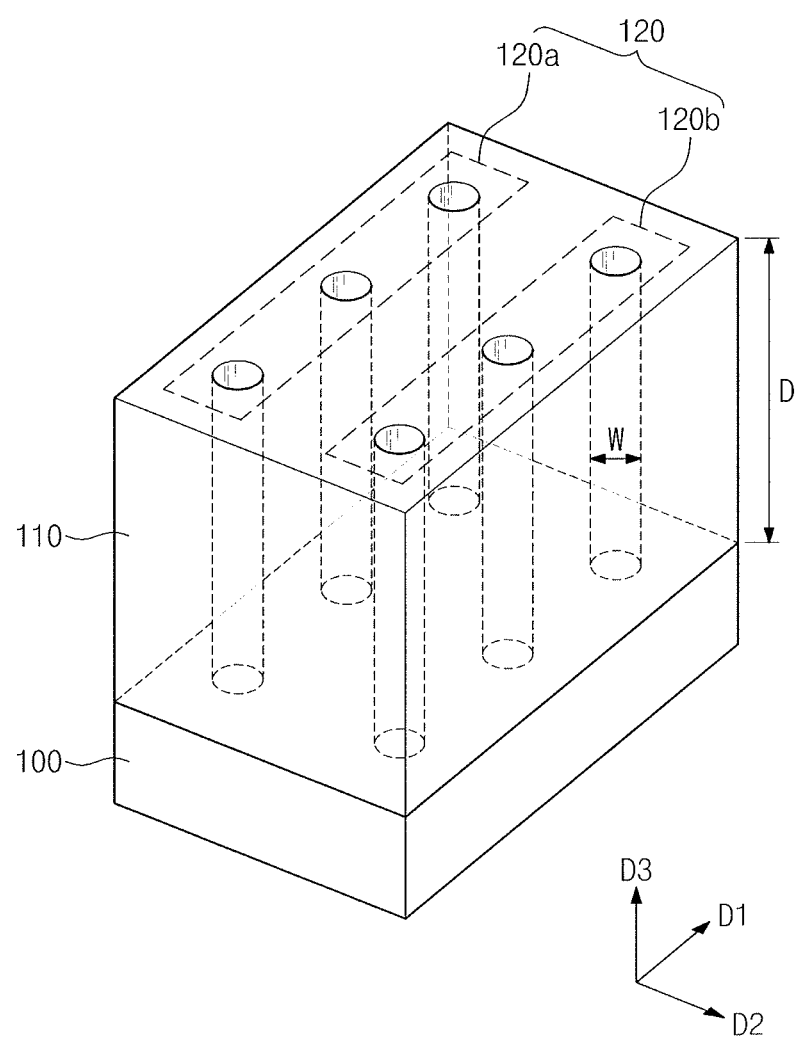
FIGS. 4, 5A, and 6 illustrate perspective views of a method of inspecting a semiconductor device according to example embodiments.
Figure 5A:
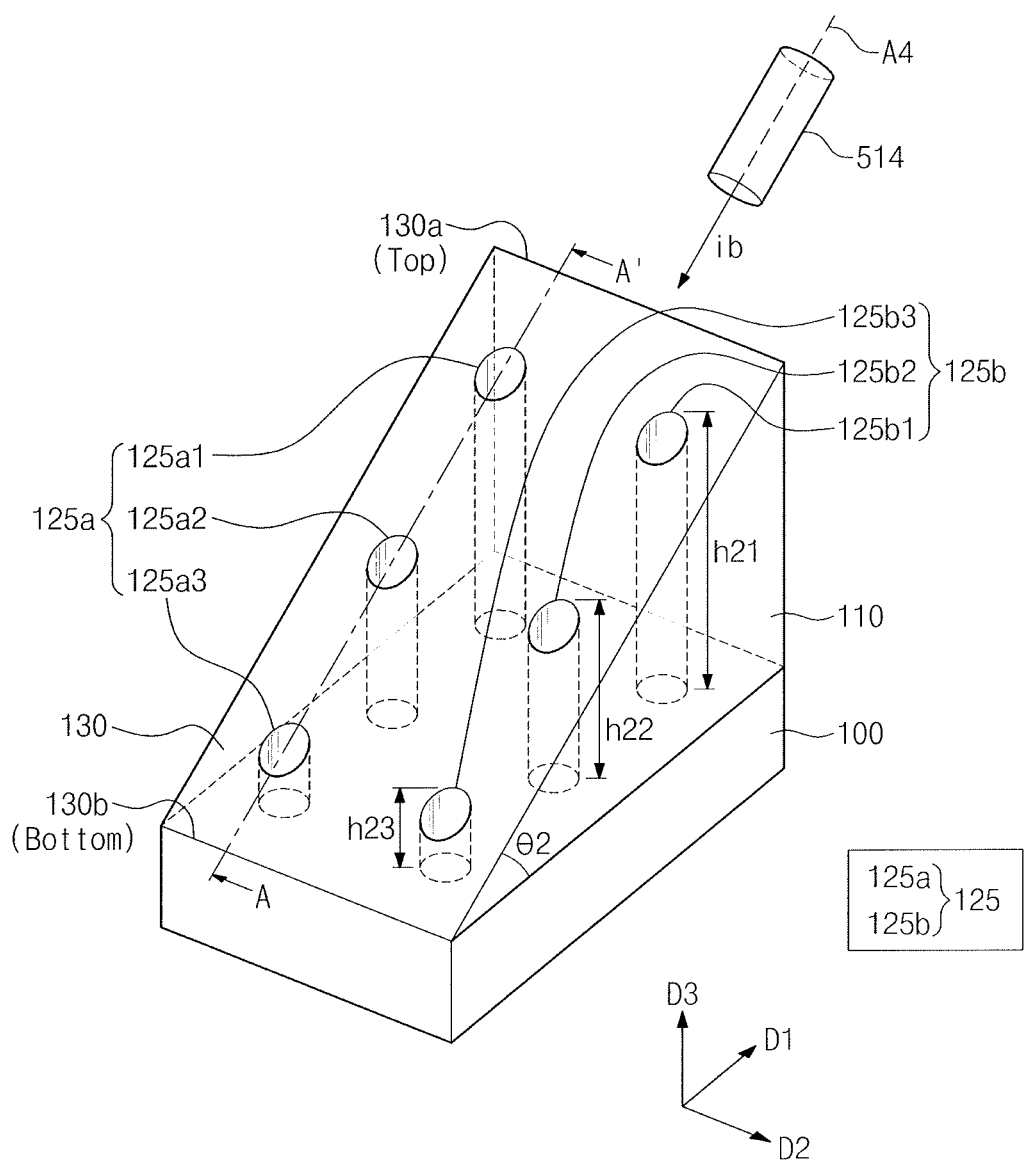
Figure 5B:
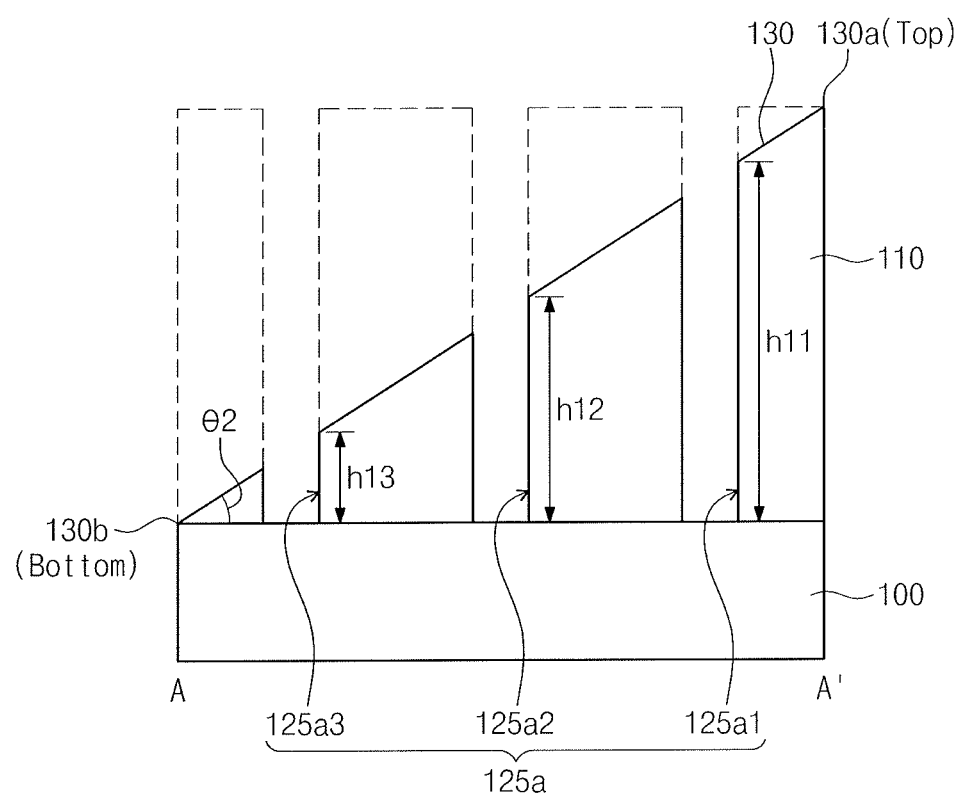
FIG. 5B illustrates a sectional view taken along line A-A' of FIG. 5A.
Figure 6:
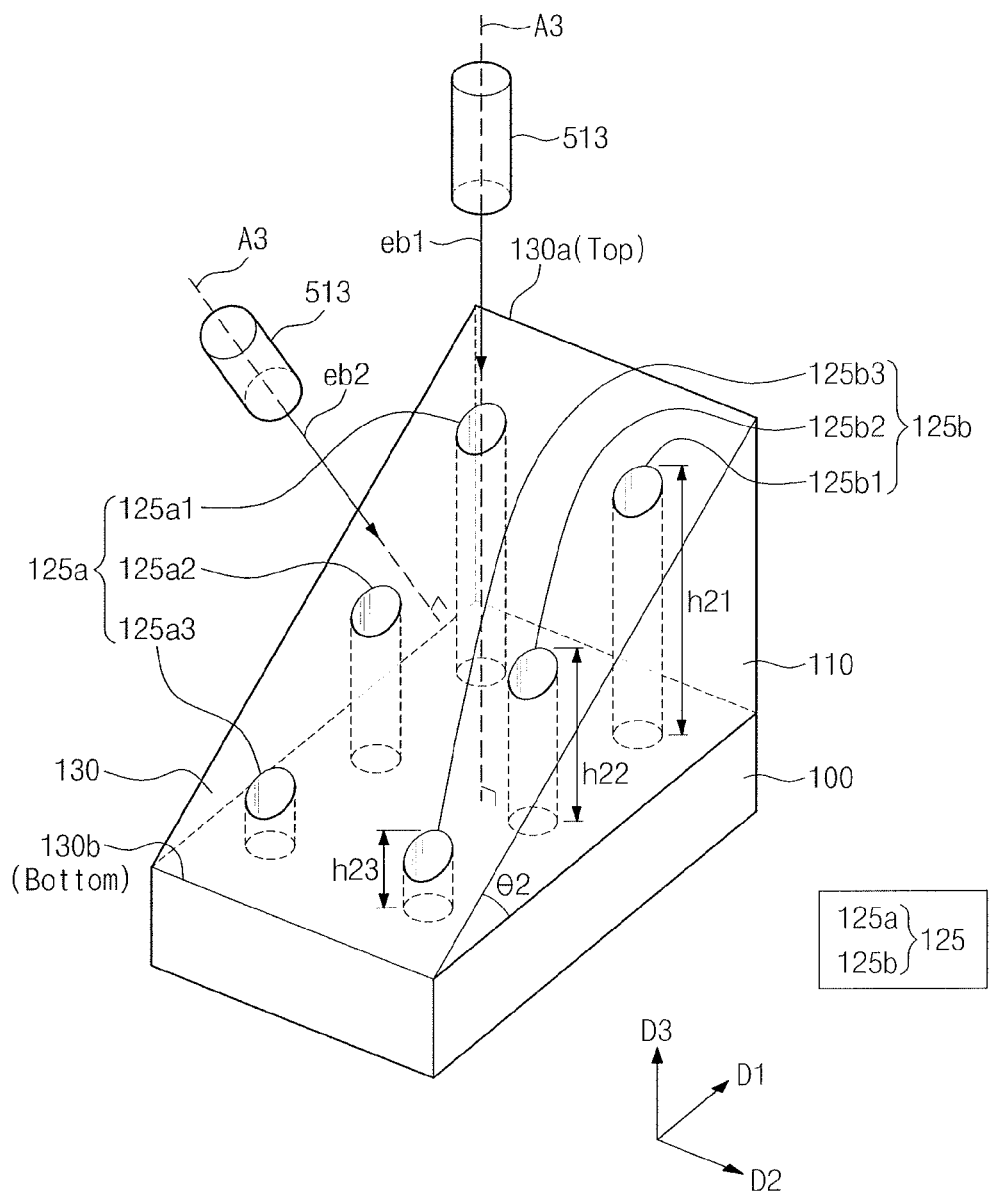
Figure 7A:
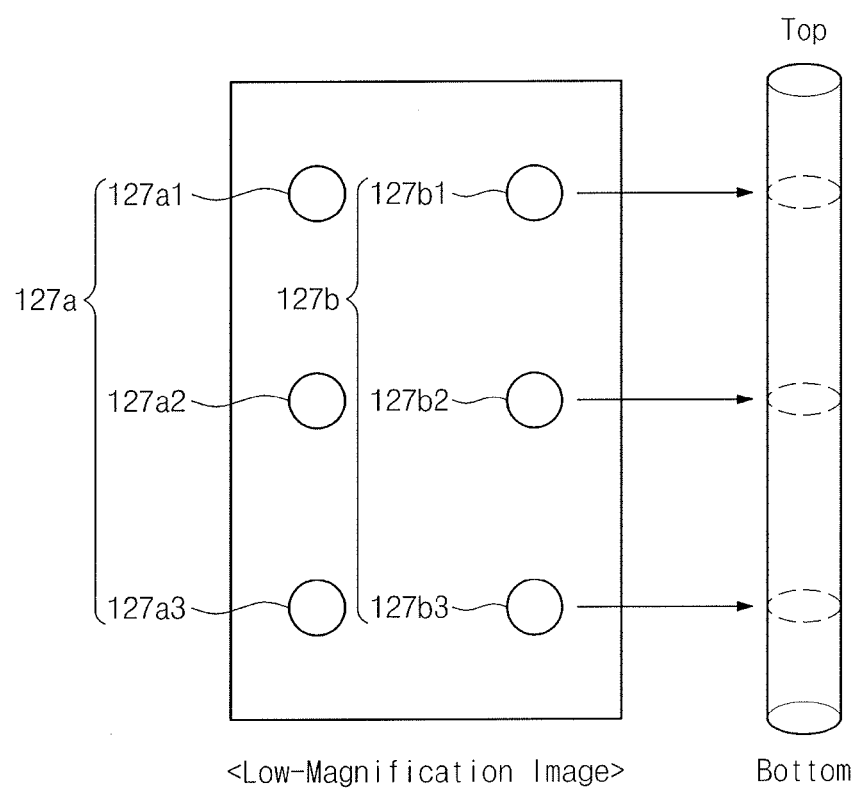
FIGS. 7A and 7B illustrate diagrams of image data obtained from a cutting surface of FIG. 6.
Figure 7B:
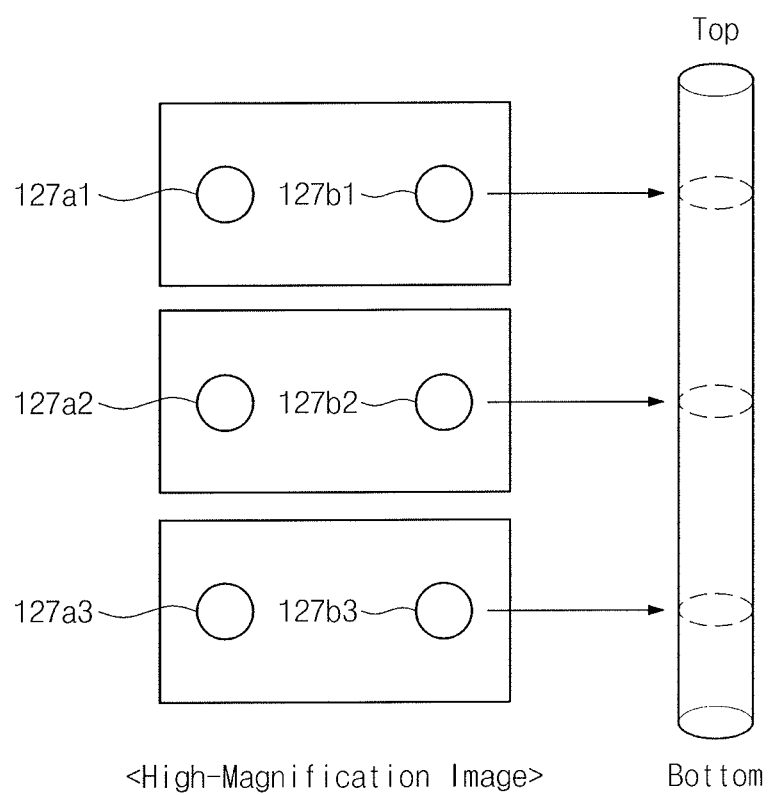

FIG. 3 is a flow chart illustrating a method of inspecting a semiconductor device, according to example embodiments. FIGS. 4, 5A, and 6 are perspective views exemplarily illustrating a method of inspecting a semiconductor device, according to example embodiments. FIG. 5B is a sectional view taken along line A-A' of FIG. 5A. FIGS. 7A and 7B are diagrams provided to illustrate image data obtained from a cutting surface of FIG. 6.

Referring to FIGS. 3 and 4, the substrate 100, on which a mold layer 110 with a plurality of mold openings 120 is provided, may be provided (S10). The substrate 100 may be, e.g., a silicon wafer, a germanium wafer, or a silicon-germanium wafer. The mold layer 110 with the mold openings 120 may be used in a process of fabricating a semiconductor device. The substrate 100 may be a wafer including a plurality of chip regions, each of which will be used as the semiconductor device. The mold layer 110 with the mold openings 120 may be a part of a plurality of patterns provided on each chip region. For the sake of simplicity, the description that follows will refer to one of several inspection regions, which can be selected from each wafer, and the mold layer 110 provided thereon.

In example embodiments, the mold layer 110 may be formed of at least one of a semiconductor material, a conductive material, or an insulating material. As an example, the mold layer 110 may be formed of at least one semiconductor material, e.g., a semiconductor wafer or an epitaxial layer. As another example, the mold layer 110 may be formed of at least one of conductive materials including doped polysilicon, metal silicides, metals, or metal nitrides. As still another example, the mold layer 110 may be formed of at least one of insulating materials including silicon oxide, silicon nitride, silicon oxynitride, or low-k materials having dielectric constants lower than that of silicon oxide. As yet another example, the mold layer 110 may be formed of crystalline silicon, amorphous silicon, doped silicon, silicon germanium, or a carbon-based material. Furthermore, the mold layer 110 may be formed to have a single-layered or multi-layered structure. For example, the mold layer 110 may include a plurality of insulating layers and/or at least one conductive or semiconductor layer interposed between the insulating layers. In addition, the mold layer 110 may include at least one of a semiconductor pattern, a conductive pattern, and an insulating pattern.

In example embodiments, each of the mold openings 120 may have a hole-shaped structure penetrating the mold layer 110. As an example, each of the mold openings 120 may have an opened-hole shape exposing the top surface of the substrate 100. Each of the mold openings 120 may have a circular shape, when viewed in a plan view. However, example embodiments may not be limited thereto, e.g., each of the mold openings 120 may have a polygonal shape when viewed in a plan view. Further, although not illustrated, the mold openings 120 may be provided in the form of a trench or a groove. An example in which the mold openings 120 have the trench-shaped structure will be described in detail below.

When viewed in a plan view, the mold openings 120 may be two-dimensionally arranged. In other words, the mold openings 120 may be arranged in first and second directions D1 and D2 crossing each other to form a plurality of rows and a plurality of columns. As an example, the mold openings 120 may include a first group of mold openings 120a, which are arranged along the first direction D1 to form a first column, and a second group of mold openings 120b, which are arranged along the first direction D1 to form a second column spaced apart from the first group in the second direction D2. Although not illustrated, the mold openings 120 may be arranged to form a plurality of rows and a plurality of columns, but in adjacent ones of the columns, the mold openings 120 may be arranged in a zigzag manner along the first direction D1. The mold openings 120 may be formed by forming a mask pattern on the mold layer 110 and anisotropically etching the mold layer 110 using the mask pattern as an etch mask.

Meanwhile, an increasing demand for a semiconductor device with high density leads to an increase in aspect ratio (i.e., a ratio of height D to width W) of the mold openings 120. As an example, the mold openings 120 may be formed to have a high aspect ratio ranging from about 1:5 to about 1:100. Here, the width W of the mold openings 120 may be defined as a diameter of the mold opening 120 delimited by an inner sidewall of the mold layer 110. Also, the height D of the mold openings 120 may be defined as a vertical distance between top and bottom surfaces of the mold opening 120. The increase in aspect ratio of the mold openings 120 may lead to a difficulty in an etching process for forming the mold openings 120. For example, it becomes more and more difficult to control process uniformity in the etching process for forming the mold openings 120. This may lead to a process or pattern failure in the etching process, e.g., the mold openings 120 may not have a desired shape after the etching process. Here, the pattern failure may refer to non-uniformity in vertical profile of the mold openings 120 that is over a given criteria. As an example, the pattern failure of the mold openings 120 may be evaluated in light of striation, distortion, bowing, or deflection. Here, the term "striation" refers to non-uniformity in diameter of the mold opening 120, and the term "distortion" refers to a difference between longitudinal and traversal lengths of the mold opening 120 or a ratio of the longitudinal length to the traversal length. The term "bowing" refers to a variation in diameter of the mold opening 120 along a vertical direction, and the term "deflection" refers to the extent of bending of the mold opening 120 along the vertical direction. The inspection method according to example embodiments may be used to more effectively monitor the above pattern failures, which may occur in the mold openings 120.

Referring to FIGS. 1 through 3 and FIGS. 5A and 5B, the substrate 100 provided with the mold layer 110 may be loaded on the stage 512 of the semiconductor test apparatus 510. Next, the focused ion beam "ib" may be irradiated toward the substrate 100 to perform a milling process on the mold layer 110. Hereinafter, the milling process using the focused ion beam "ib" will be referred to as "FIB milling".

According to example embodiments, the FIB milling may be performed at an angle inclined, e.g., oblique, with respect to a direction normal to the top surface of the substrate 100. In other words, the focused ion beam "ib" emitted from the ion beam milling unit 514 may be incident to the mold layer 110 at such an inclined angle that the mold layer 110 is cut in a diagonal direction. That is, as a result of irradiating the focused ion beam "ib" toward the mold layer 110 at an inclined angle, an inclined cutting surface 130 may be formed in the mold layer 110 (S20).

In detail, during the FIB milling, the stage 512 may be disposed in such a way that its top surface 512a is perpendicular to the axis A3 of the image measurement unit 513. In this case, since the image measurement unit 513 is inclined, e.g., at an oblique angle, with respect to the ion beam milling unit 514 at the first angle θ1, the axis A4 may form a second angle θ2 (where θ2=90°−θ1) with respect to the top surface 512a of the stage 512. Accordingly, the focused ion beam "ib" emitted from the ion beam milling unit 514 may be incident onto the mold layer 110 at the second angle θ2 with respect to the top surface of the substrate 100, and the mold layer 110 on the substrate 100 may be diagonally cut with respect to the top surface of the substrate 100. When viewed in a plan view, the FIB milling may be performed in a direction parallel to the column or row of the mold openings 120. For example, the FIB milling may be performed along a direction antiparallel to the first direction D1, when viewed in a plan view. If necessary, the irradiation angle (i.e., θ2) in the FIB milling may be changed. For example, such a change in the irradiation angle may be achieved by adjusting the rotation of the stage 512 about the first rotating axis A1 or an angle between the top surface 512a of the stage and the axis A4 of the ion beam milling unit.

As a result of the diagonal milling, the cutting surface 130 of the mold layer 110 may have a first edge 130a, which may correspond to a starting point of the FIB milling and may be called "Top", and a second edge 130b. which may correspond to an end point of the FIB milling and may be called "Bottom". The first edge 130a of the cutting surface 130 may be positioned adjacent to the top surface of the mold layer 110, and the second edge 130b of the cutting surface 130 may be positioned adjacent to the top surface of the substrate 100. In other words, the cutting surface 130 may be a downwardly inclined surface extending from the top surface of the mold layer 110 toward the top surface of the substrate 100. The mold openings may be exposed by the cutting surface 130, and hereinafter, such mold openings will be referred to as "milling openings 125". The milling openings 125 may have different heights from each other and may be arranged along a specific direction to form at least one column or row (hereinafter, for brevity, it will be referred to as a column). As an example, the milling openings 125 may include a first group of milling openings 125a, which are disposed to have different heights and form a first column, and a second group of milling openings 125*b*, which are disposed to have different heights and form a second column.

In detail, the first group of the milling openings 125*a* may include eleventh to thirteenth milling openings 125*a*1-125*a*3 having eleventh to thirteenth heights h11-h13, respectively. Here, the twelfth height h12 may be less than the eleventh height h11 and larger than the thirteenth height h13. The second group of the milling openings 125*b* may include twenty first to twenty third milling openings 125*b*1-125*b*3 having twenty first to twenty third heights h21-h23, respectively. Here, the twenty second height h22 may be less than the twenty first height h21 and larger than the twenty third height h23. Here, the height of each of the milling openings 125 may be defined as a largest vertical distance from a bottom surface of each milling opening 125 to the cutting surface 130, e.g., from the top surface of the substrate 100 exposed by each milling opening 125 to the cutting surface 130 along a normal to the substrate 100. In the present embodiment, each of the milling openings 125*a* of the first group may have substantially the same height as a corresponding one of the milling openings 125*b* of the second group positioned adjacent thereto in the second direction D2. In other words, each of the eleventh to thirteenth heights h11-h13 may be substantially equal to a corresponding one of the twenty first to twenty third heights h21-h23.

Referring to FIGS. 1 through 3, 6, 7A, and 7B, image data (e.g., a SEM image) of the cutting surface 130 may be obtained by exposing the cutting surface 130 with an electron beam (S30). The image data may include contour images of the milling openings 125 exposed by the cutting surface 130. Hereinafter, the operation of obtaining the image data using the electron beam will be called "SEM imaging".

In example embodiments, an electron beam "eb1" may be emitted in a direction normal to the top surface of the substrate 100. The image data obtained in this manner may be referred to as "a plane projection image" of the cutting surface 130. For example, the plane projection image may be an image, seen in the direction normal to the top surface of the substrate 100, of the cutting surface 130 of the mold layer 110. In the plane projection image, the contour images of the milling openings 125 may have substantially the same (i.e., circular) shape as the shape, seen in a plan view, of the mold openings 120 (e.g., as seen in FIG. 4). To obtain the plane projection image on the cutting surface 130, in the SEM imaging operation, the image measurement unit 513 may be disposed in such a way that its axis A3 is oriented to be perpendicular to the top surface 512*a* of the stage 512.

In other example embodiments, an electron beam "eb2" may be emitted in a direction normal to the cutting surface 130. In this case, the image data may be measured along a profile of the cutting surface 130. Accordingly, in the present embodiment, each of the contour images of the milling openings 125 may have an elliptical shape. In the present embodiment, the image measurement unit 513 may be disposed in such a way that its axis A3 is oriented to be perpendicular to the cutting surface 130 of the mold layer 110. Meanwhile, the incident angle of the electron beam "eb2", i.e., an angle between the axis A3 of the image measurement unit 513 and the top surface 512*a* of the stage 512, may be controlled by adjusting the rotation of the stage 512. Hereinafter, for the sake of simplicity, the description that follows will refer to an example of the present embodiment in which the electron beam is incident on the cutting surface 130 in a direction normal to the top surface of the substrate 100.

According to example embodiments, obtaining the image data of the cutting surface 130 may include obtaining a low-magnification image of the cutting surface and obtaining a high-magnification image of the cutting surface. In detail, the low-magnification image may be obtained by taking a full image of a specific region (e.g., field of view) of the cutting surface 130 at a low magnification. For example, the low-magnification image may be taken in such a way to include contour images of all of the milling openings 125 exposed in the specific region of the cutting surface 130. As an example, the low-magnification image may be taken to include all of the contour images (hereinafter, first contour images 127*a*) of the first group of the milling openings 125*a* and all of the contour images (hereinafter, second contour images 127*b*) of the second group of the milling openings 125*b*, as shown in FIG. 7A. Here, the first contour images 127*a* may include eleventh to thirteenth contour images 127*a*1-127*a*3, which are the contour images of the eleventh to thirteenth milling openings 125*a*1-125*a*3, and the second contour images 127*b* may include twenty first to twenty third contour images 127*b*1-127*b*3, which are the contour images of the twenty first to twenty third milling openings 125*b*1-125*b*3.

The high-magnification image of the cutting surface may be obtained by taking a portion of the specific region (e.g., field of view) of the cutting surface 130 at a high magnification. The SEM imaging may include taking a plurality of high-magnification images of the cutting surface 130, such that the specific region (e.g., field of view) of the cutting surface 130 can be fully spanned by the plurality of high-magnification images. In other words, each of the high-magnification images of the cutting surface may be obtained to include a contour image of some of the milling openings 125, but the plurality of the high-magnification images may be obtained to be able to provide full information on all of the milling openings 125 in a collective manner. As an example, as shown in FIG. 7B, the high-magnification images may include a first high-magnification image with eleventh and twenty first contour images 127*a*1 and 127*b*1, a second high-magnification image with twelfth and twenty second contour images 127*a*2 and 127*b*2, and a third high-magnification image with thirteenth and twenty third contour images 127*a*3 and 127*b*3.

The contour images may contain information on sectional shapes of the milling openings 125 associated therewith. In other words, as shown in FIGS. 7A and 7B, the contour images of the milling openings 125 may contain information on sectional shapes of the mold openings 120 at a corresponding height or level. According to example embodiments, by analyzing the sectional information contained in the contour images, it is possible to obtain process parameters capable of representing a vertical or sectional profile of the mold openings 120 (i.e., as a function of a vertical level).

The image data obtained by the afore-described method may be transferred to the computer system 520. Thereafter, the contour images of the milling openings 125 may be processed to obtain process parameters representing information on a three-dimensional structure of the mold openings 120 (S40). The process parameters may be calculated by the controller 522 of the computer system 520, based on a previously-developed algorithm. Hereinafter, a method of calculating such process parameters from the image data will be described in detail.

First, a method of calculating the process parameters from the low-magnification image of the cutting surface 130 will be explained.

Figure 8:
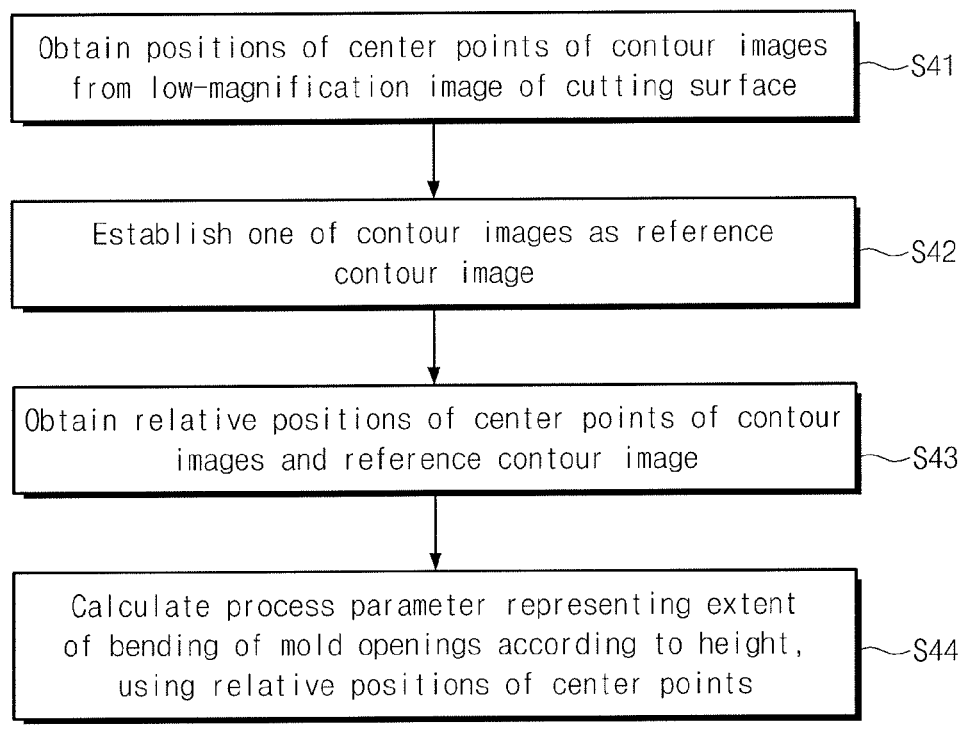
FIG. 8 illustrates a flow chart of operation S40 of FIG. 3 according to example embodiments.
Figure 9:
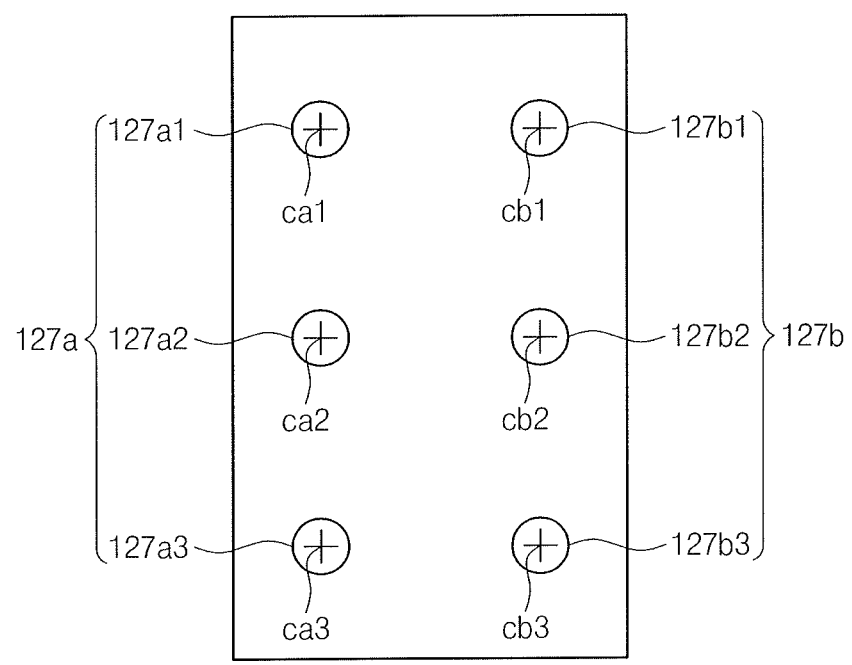
FIG. 9 illustrates a diagram of a low-magnification image on a cutting surface obtained through operation S30 of FIG. 3, to describe operation 41 of FIG. 8.
Figure 10:
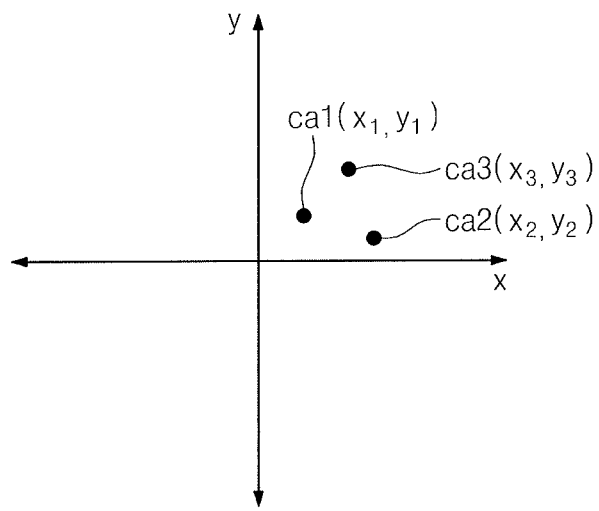
FIG. 10 illustrates a diagram of positions of center points of first contour images, to describe operation 43 of FIG. 8.
Figure 11:
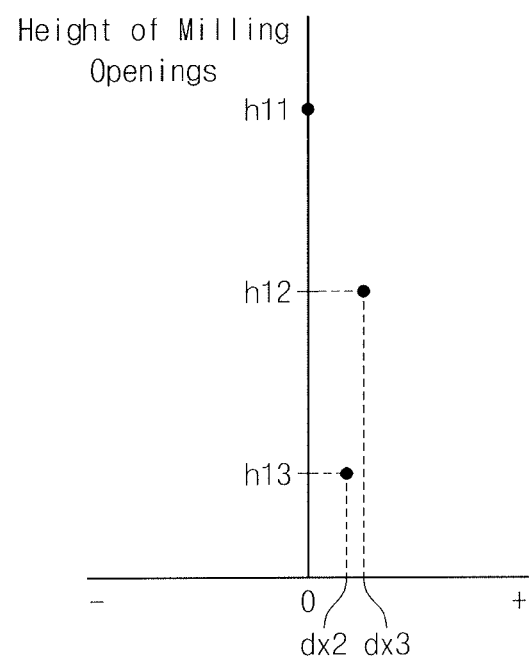
FIG. 11 illustrates a graph of relative positions of center points of first contour images obtained in operation S43 and heights of corresponding first milling openings.

FIG. 8 is a flow chart illustrating detailed stages in operation S40 of FIG. 3, according to example embodiments. FIG. 9 is a diagram exemplarily illustrating a low-magnification image of the cutting surface 130 obtained in operation S30 of FIG. 3, to describe operation 41 of FIG. 8. FIG. 10 is a diagram exemplarily illustrating positions of center points of first contour images, to describe operation 43 of FIG. 8. FIG. 11 is a graph plotting relative positions of center points of first contour images obtained in operation S43 and heights of corresponding first milling openings.

Referring to FIGS. 8 and 9, positions of center points of the contour images may be obtained from the low-magnification image (S41). For example, positions of center points of the first contour images 127a may be obtained, as shown in FIG. 9. Here, the center points of the first contour images 127a may include an eleventh center point ca1 of the eleventh contour image 127a1, a twelfth center point ca2 of the twelfth contour image 127a2, and a thirteenth center point ca3 of the thirteenth contour image 127a3. One of the first contour images 127a may be established or selected as a reference contour image (S42). In example embodiments, the reference contour image may be selected as a contour image of one, mostly adjacent to the first edge 130a of the cutting surface 130, of the milling openings 125a of the first group. In the present embodiment, the reference contour image may be the eleventh contour image 127a1. Although not illustrated, operations S41 and S42 may be performed in a reversed order.

Next, the center point of each of the first contour images 127a may be obtained relative to the center point of the reference contour image (e.g., the eleventh contour image 127a1). In example embodiments, the relative positions of the center points may be given by a difference in x-coordinates of the center points of the reference contour image and other first contour images 127a, when represented in an x-y coordinate system. For example, as shown in FIG. 10, if the eleventh, twelfth, and thirteenth center points ca1, ca2, and ca3 have x- and y-coordinates of (x1, y1), (x2, y2), and (x3, y3) in the x-y coordinate system (i.e., corresponding to respective directions D2 and D1 in FIG. 6), the relative positions in FIG. 11, in the x direction, of the eleventh, twelfth, and thirteenth center point ca1, ca2, and ca3 may be given by dx1=x1−x1 (i.e., zero), dx2=x2−x1, and dx3=x2−x1, respectively.

The relative positions of the center points of the first contour images 127a may be used to calculate a process parameter representing a vertical profile (e.g., the extent of bending) of the mold openings 120a constituting the first group (S44). In detail, such a process parameter may be obtained by parameterizing the relative positions of the center points of the first contour images 127a (e.g., through a numeric representation based on dispersion or standard deviation of the relative positions). Further, the relative positions of the center points of the first contour images 127a may be illustrated by a distribution chart, in which heights of the milling openings 125a associated therewith are plotted. FIG. 11 is an example of such distribution charts. This distribution chart may be used as a criterion for qualitatively evaluating the extent of bending of the mold openings 120a, which are associated with the milling openings 125a constituting the first group and their dependency on height.

In the meantime, the same calculation may be applied to the second contour images 127b, which are associated with the milling openings 125b constituting the second group. In other words, positions of the center points of the second contour images 127b may be used to calculate at least one process parameter representing the extent of bending of the mold openings 120b, which are associated with the milling openings 125b constituting the second group and their dependence on height. To sum up, for each group of the mold openings 120a and 120b constituting different columns or rows, the process parameters representing the extent of bending thereof and its dependence on height can be obtained from the low-magnification image of the cutting surface.

In addition, as in the present embodiment, in the case where the eleventh to thirteenth milling openings 125a1-125a3 have the same heights as the twenty first to twenty third milling openings 125b1-125b3, respectively, a process parameter representing the extent of overall bending of the mold openings 120 may be obtained using a mean value of the positions of the center points of the milling openings with the same height (e.g., a mean value of the relative positions of the center points of the eleventh and twenty first contour images 127a1 and 127b1, a mean value of the relative position of the center point of the twelfth and twenty second contour images 127a2 and 127b2, and a mean value of the relative positions of the center points of the thirteenth and twenty third contour images 127a3 and 127b3).

The case that the number of the mold openings 120 is six has been described as an example of the present embodiment, but in certain embodiments, the inspection region may be expanded in such a way that the mold openings 120 are more included therein. This makes it possible to increase the population parameter to be used to calculate the process parameters and consequently to improve reliability of the obtained process parameter.

Next, a method of calculating the process parameters from the high-magnification images on the cutting surface will be explained.

Figure 12:
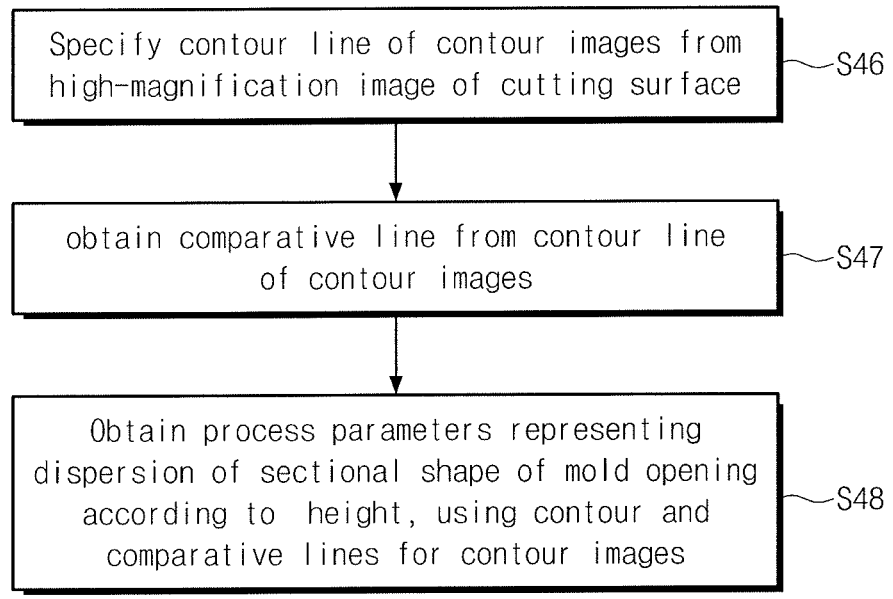
FIG. 12 illustrates a flow chart of operation S40 of FIG. 3, according to other example embodiments.
Figure 13:
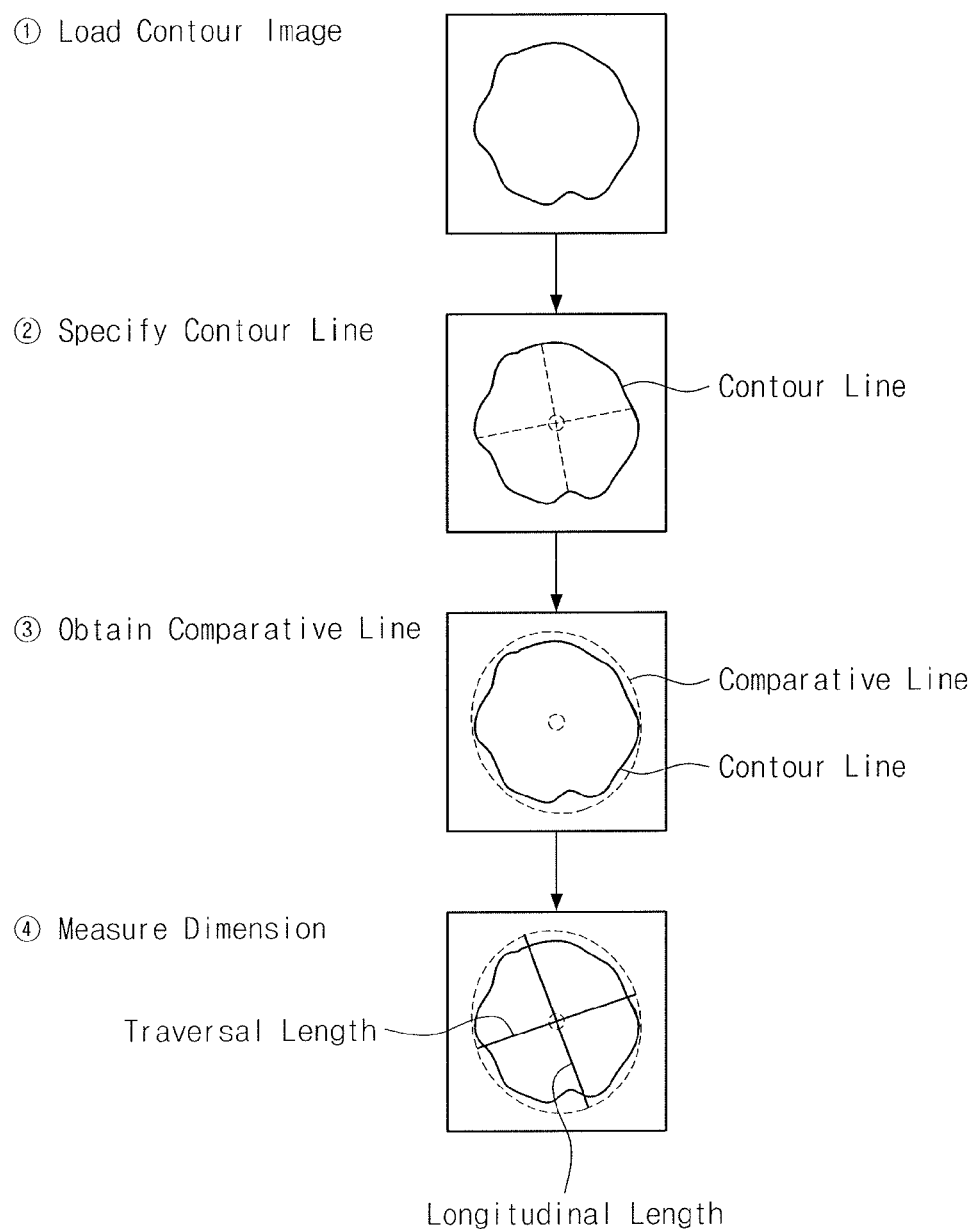
FIG. 13 illustrates a schematic diagram of operations of FIG. 12.

FIG. 12 is a flow chart specifically illustrating detailed stages in operation S40 of FIG. 3, according to other example embodiments. FIG. 13 is a schematic diagram exemplarily illustrating stages of FIG. 12. FIGS. 14A through 14D are distribution charts of measurement data obtained from high-magnification images of cutting surface 130.

Referring to FIGS. 12 and 13, contour images obtained from the high-magnification image of the cutting surface may be loaded on the controller 522 from the memory device 524 of FIG. 1, as illustrated in the reference numeral ①. Next, a contour line for each of the contour images may be specified, as illustrated in the reference numeral ② (S46). As an example, the contour line may be specified for each of the eleventh to thirteenth contour images 127a1-127a3 and the twenty first to twenty third contour images 127b1-127b3, which are obtained from the first to third high-magnification images of FIG. 7B. Thereafter, a comparative line for the contour image may be obtained from the contour line for each of the contour images, as illustrated in the reference numeral ③ (S47). In example embodiments, the comparative line for the contour image may be obtained by an ellipse fitting method. The comparative line for each of the contour images may be defined as an ideal contour line which can be obtained from the contour line for each contour image.

Next, the contour and comparative lines for the contour images may be used to obtain process parameters representing dispersion of the sectional shape of the mold opening according to a change in height (S48). For example, dimensions of the contour and comparative lines may be measured as illustrated in the reference numeral ④, and then, the measured dimension values may be used to obtain the desired process parameter. In example embodiments, the process parameters, which represent the dispersion of the sectional shape of the mold opening according to a change in height, may include a first process parameter describing how striation of the mold opening is changed depending on a change in height, a second process parameter describing how bowing of the mold opening is changed depending on a change in height, and a third process parameter describing how distortion of the mold opening is changed depending on a change in height.

Figure 14A:
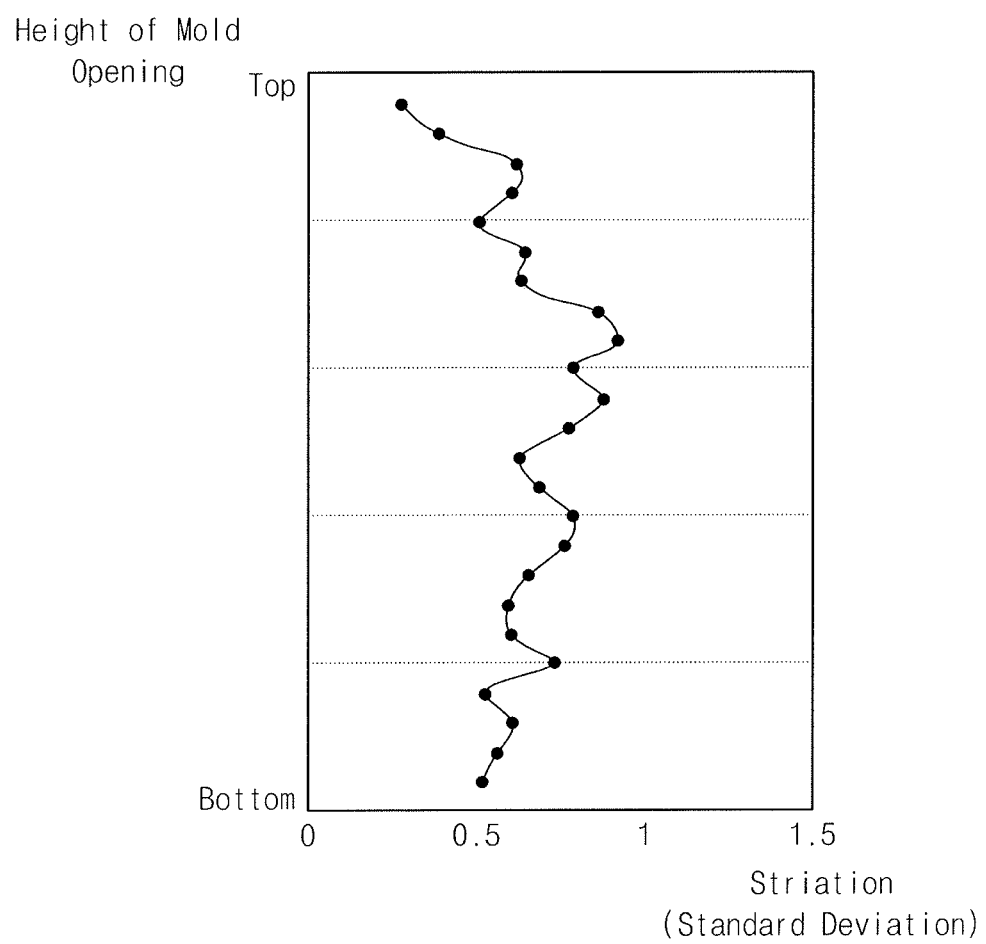
FIGS. 14A through 14D illustrate distribution charts of measurement data obtained from high-magnification images on cutting surfaces.

In example embodiments, the first process parameter may be calculated from differences between the contour and comparative lines of the contour images. In detail, the first process parameter may be obtained by calculating dispersion or standard deviation from the differences between the contour and comparative lines for each of the contour images and then parameterizing the calculated values (e.g., through a numerical representation using dispersion or standard deviation of the calculated differences). Here, the calculated differences of the contour and comparative lines may be defined as a representative value expressing an extent of the striation of the mold opening at a height associated with the corresponding contour image. As an example, to respective contour images of the milling openings 125a constituting the first group, the differences between the contour and comparative lines is calculated and parameterized to obtain a first process parameter for the mold openings 120a of the first group. Similarly, the above calculation method may be applied to the milling openings 125b constituting the second group to obtain a first process parameter for the mold openings 120b of the second group. In addition, a first process parameter for all of the mold openings 120 may be obtained by adding and averaging the differences, which are obtained from the contour images of the milling openings 125a and 125b constituting the first and second groups. Furthermore, vertical distribution of the differences of the milling openings associated with respective contour images may serve as a criterion for qualitatively evaluating an extent of the striation of the mold openings according to a change in height. FIG. 14A shows an example of such a striation distribution. Meanwhile, in other example embodiments, a representative value for expressing the extent of the striation of the mold openings may be obtained by decomposing the contour line of each of the contour images into a linear spectrum with a specific length and then performing a Fourier transformation thereon.

Figure 14B:
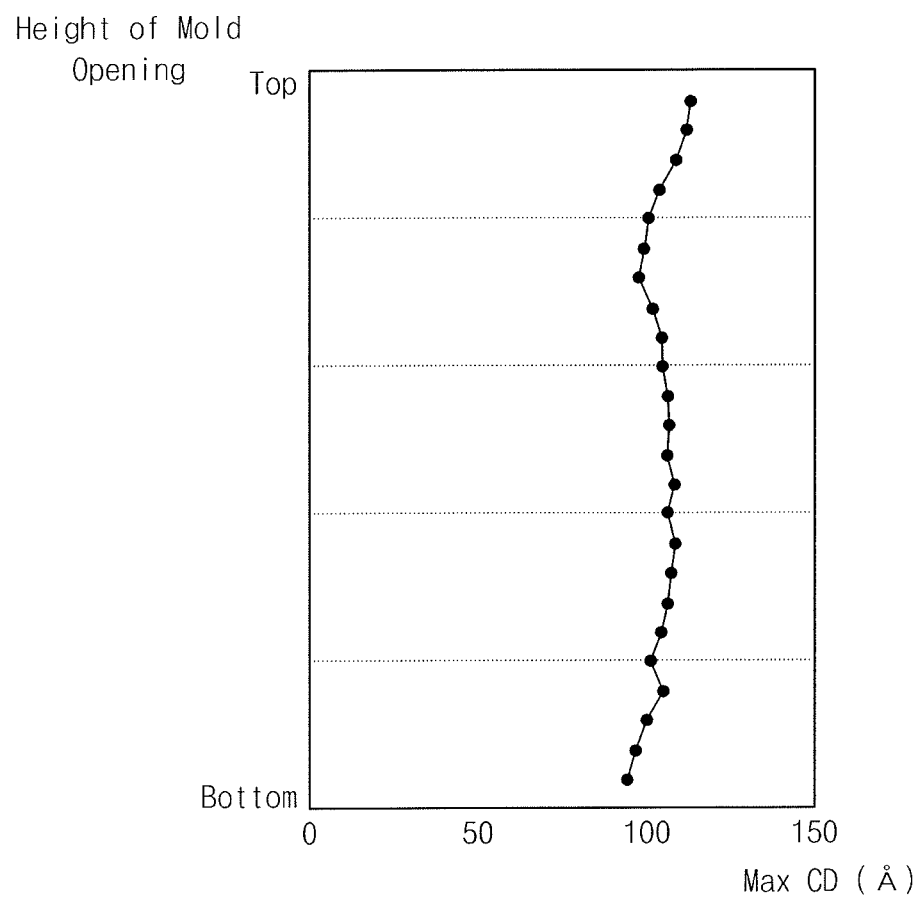
Figure 14C:
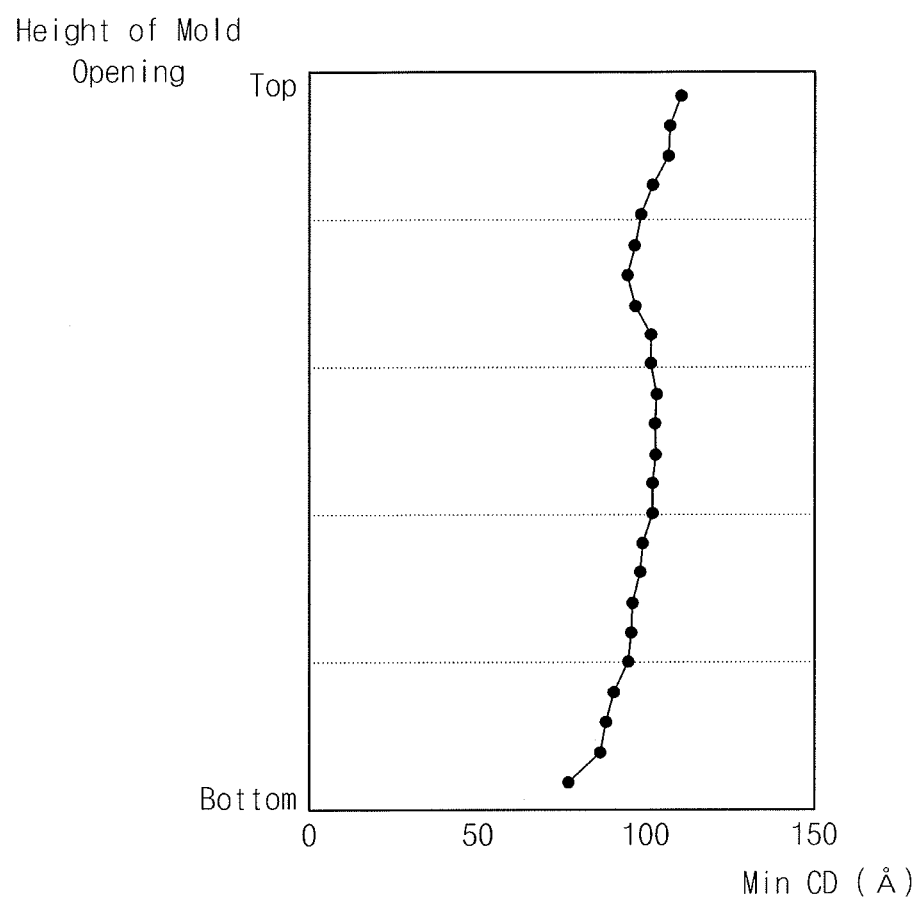

In example embodiments, the second process parameter may be obtained by measuring a longitudinal length (e.g., Max CD) or a traversal length (e.g., Min CD) of the comparative line of each of the contour images and then parameterizing the measured values (e.g., through a numeric representation using dispersion or standard deviation of the measured values). In other words, the longitudinal or traversal length of the comparative line may be defined as a reference value expressing an extent of the bowing of the mold opening at a height associated with the corresponding contour image. As an example, the second process parameter may be obtained from each or all of the contour images of the milling openings 125a and 125b constituting the first and second groups. Further, a vertical distribution of the longitudinal or traversal length of the milling openings 125 associated with respective contour images may serve as a criterion for qualitatively evaluating an extent of the bowing of the mold openings according to a change in height. FIG. 14B or FIG. 14C shows an example of such a bowing distribution.

Figure 14D:
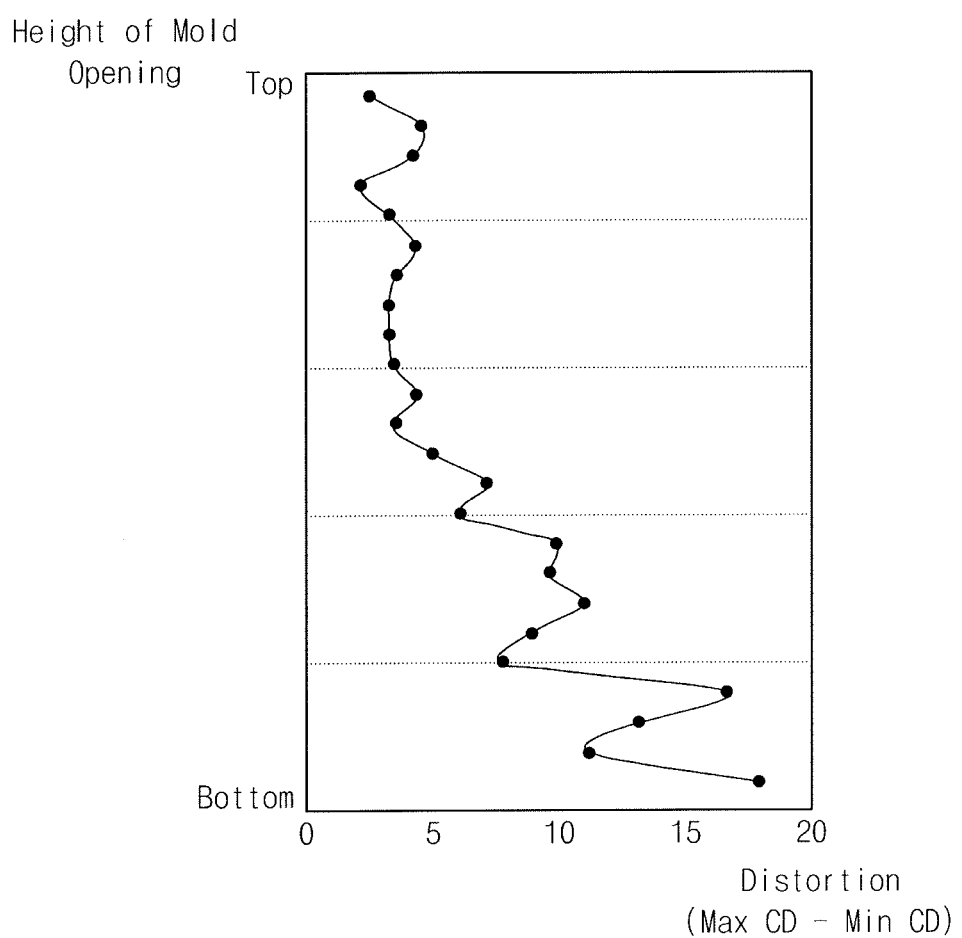

In example embodiments, the third process parameter may be obtained by calculating a difference or ratio between the longitudinal length (e.g., Max CD) and the traversal length (e.g., Min CD) of the comparative line and then parameterizing the calculated values (e.g., through a numeric representation using dispersion or standard deviation of the calculated values). In other words, the difference or ratio between the longitudinal length (e.g., Max CD) and the traversal length (e.g., Min CD) of the comparative line may be defined as a representative value expressing an extent of the distortion of the mold opening at a height associated with the corresponding contour image. As an example, the third process parameter may be obtained from each or all of the contour images of the milling openings 125a and 125b constituting the first and second groups. Further, a vertical distribution of the difference or ratio between the longitudinal and traversal lengths of the milling openings 125 associated with respective contour images may serve as a criterion for qualitatively evaluating an extent of the distortion of the mold openings according to a change in height. FIG. 14D shows an example of such a distortion distribution.

According to example embodiments, a milling process may be performed on the mold layer 110 with the mold openings 120 in a diagonal direction, and thus, the inclined cutting surface 130 may be formed in the mold layer 110. Thereafter, image data including contour images may be obtained from the milling openings 125 exposed by the cutting surface 130. The contour images of the milling openings 125 may contain information on a three-dimensional structure of the mold openings 120. Accordingly, by analyzing the contour images of the milling openings 125, it is possible to obtain process parameters associated with the three-dimensional structure of the mold openings 120. In conclusion, even when the milling process is only performed once, it is possible to effectively obtain process monitoring data on a process (e.g., an etching process) for forming the mold openings 120.

Figure 15:
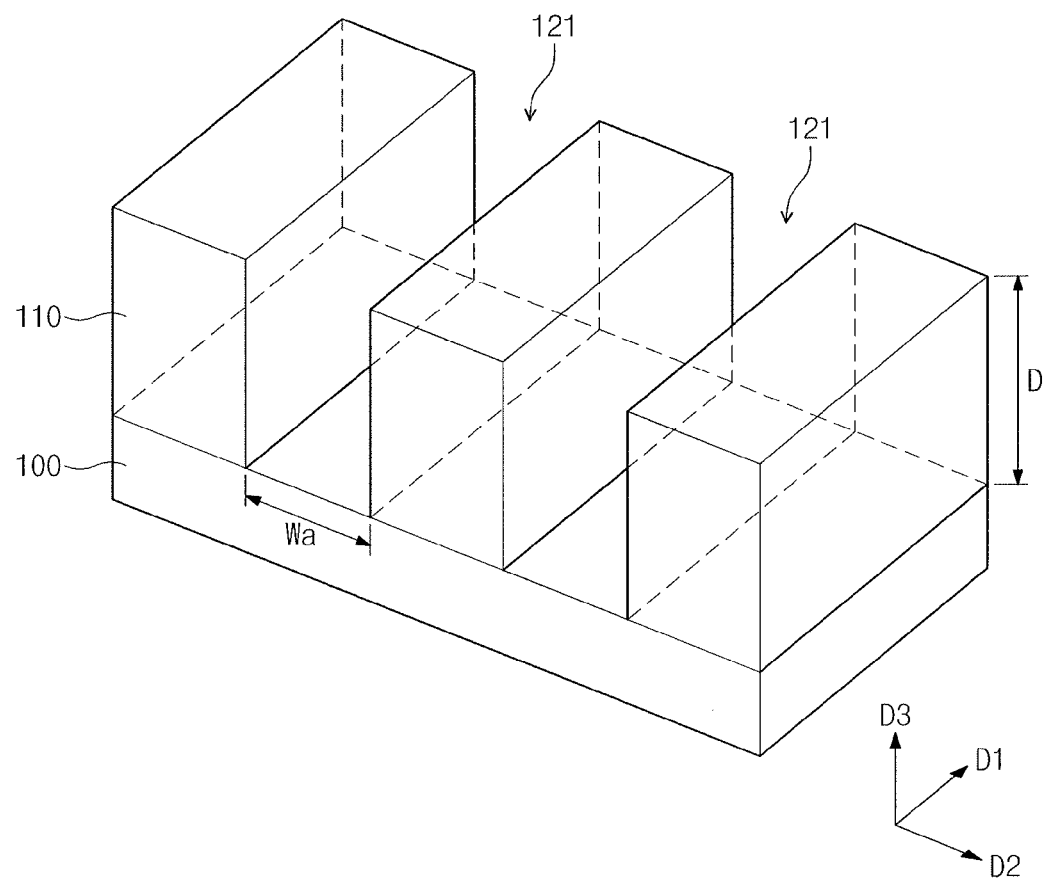
FIGS. 15 through 17 illustrate perspective views of a method of inspecting a semiconductor device according to other example embodiments.
Figure 16:
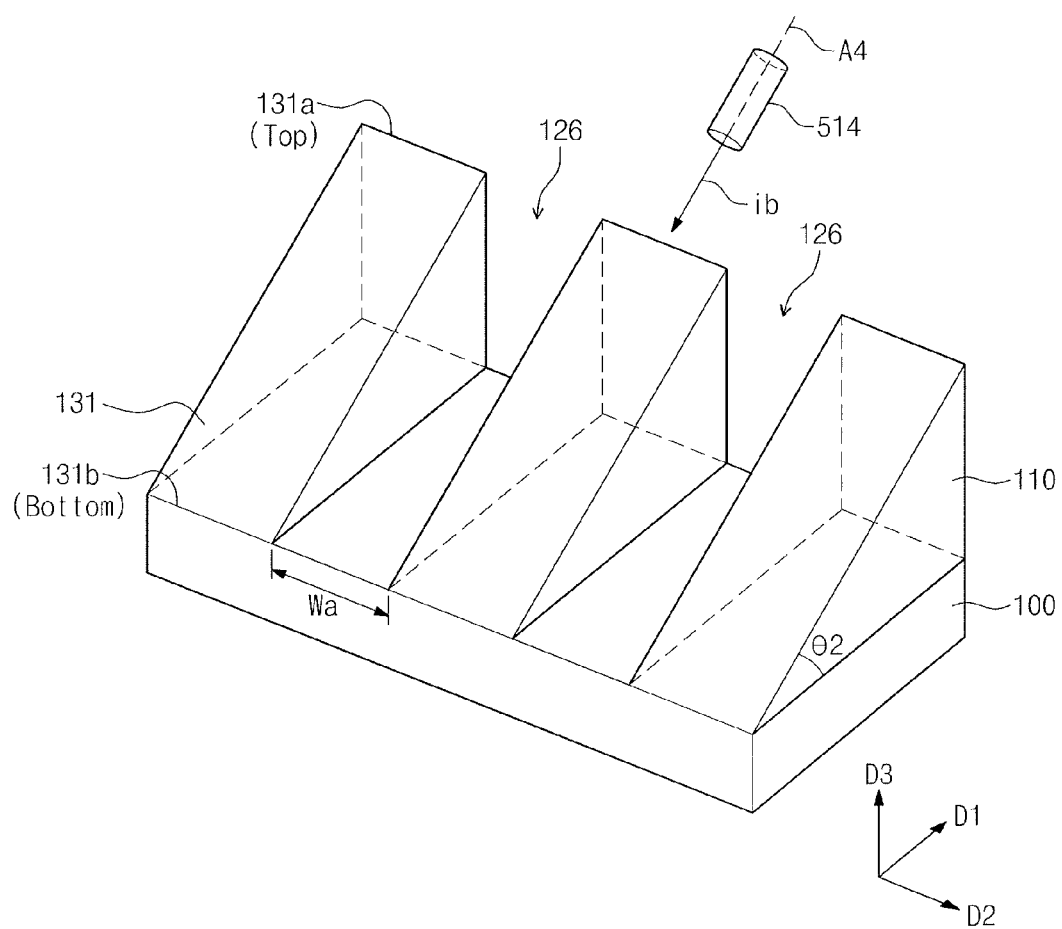
Figure 17:
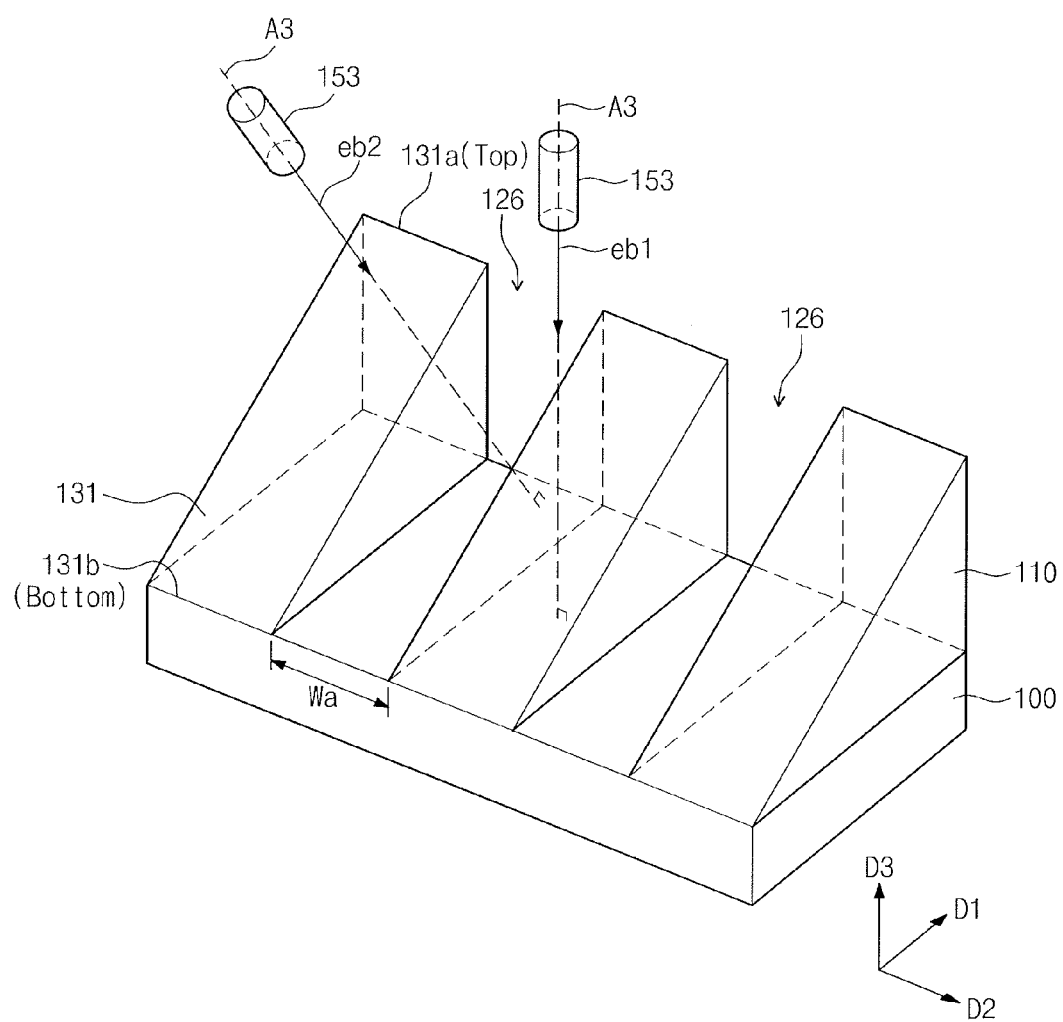
Figure 18A:
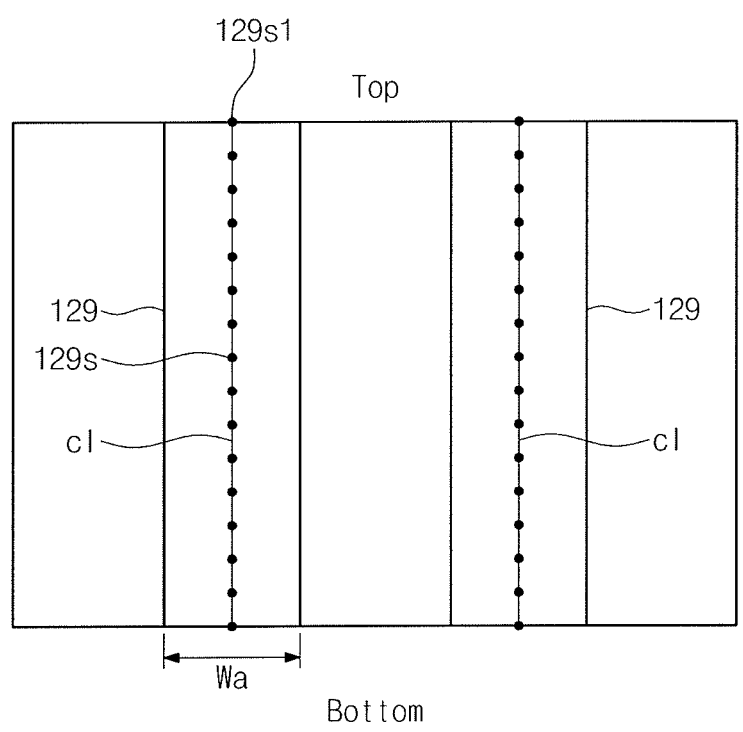
FIG. 18A illustrates a diagram of image data obtained from a cutting surface of FIG. 17.
Figure 18B:
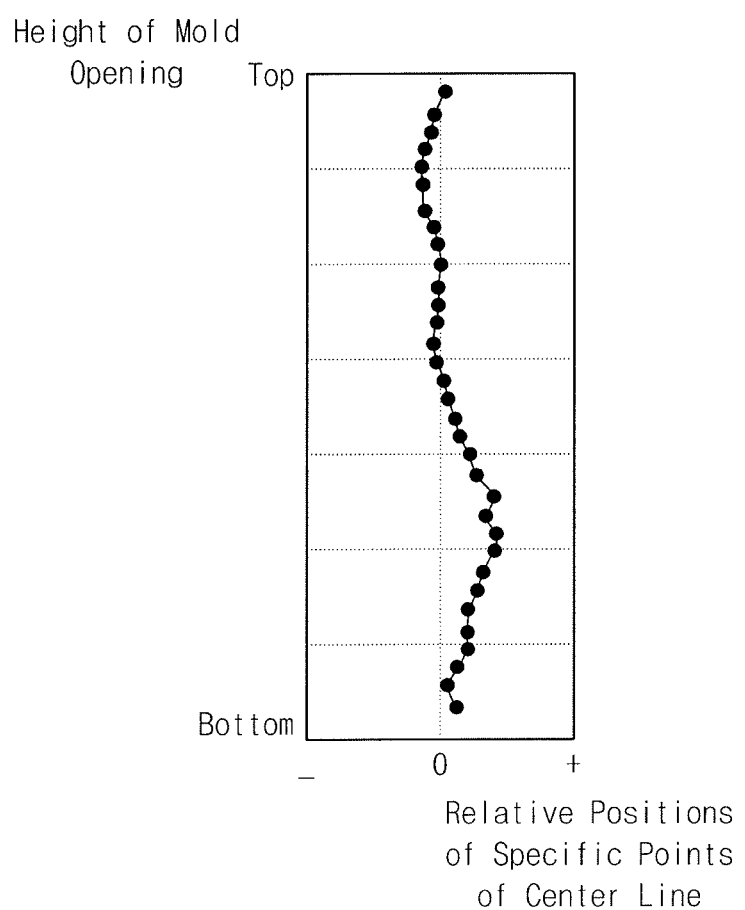
FIG. 18B illustrates a distribution chart showing bending of mold openings.

FIGS. 15 through 17 are perspective views exemplarily illustrating a method of inspecting a semiconductor device, according to other example embodiments. FIG. 18A is a diagram provided to exemplarily illustrate image data obtained from a cutting surface of FIG. 17. FIG. 18B is a distribution chart exemplarily showing bending of mold openings. For the sake of brevity, again, the elements and features of this example that are similar to those previously shown and described will not be described in much further detail.

Referring to FIG. 15, the mold layer 110 with a plurality of mold openings 121 may be provided on the substrate 100. The plurality of mold openings 121 may be line shaped trenches extending in the first direction D1. The plurality of mold openings 121 may be spaced apart from each other in the second direction D2 crossing the first direction D1. Similar to the mold openings 120 of FIG. 4, each of the mold openings 121 may be formed in such a way that its aspect ratio (i.e., a ratio of the width Wa to the height D) is high. As an example, the aspect ratio of the mold openings 121 may range from about 1:5 to about 1:100.

Referring to FIGS. 1 through 3 and FIG. 16, the substrate 100 provided with the mold layer 110 may be loaded on the stage 512 of the semiconductor test apparatus 510, and a FIB milling may be performed on the mold layer 110. Similar to FIG. 5A, the FIB milling may be performed in a direction, which is inclined, by a specific angle, with respect to a direction normal to the top surface of the substrate 100. In other words, the focused ion beam "ib" emitted from the ion beam milling unit 514 may be irradiated to the mold layer 110 at such an inclined angle, and thus, the mold layer 110 may be cut or milled in a diagonal direction. As a result, as illustrated in FIG. 16, an inclined cutting surface 131 may be formed in the mold layer 110 (S20).

In detail, during the FIB milling, the stage 512 may be disposed in such a way that its top surface 512a is perpendicular to the axis A3 of the image measurement unit 513. In this case, since the image measurement unit 513 is inclined to the ion beam milling unit 514 at the first angle θ1, the axis A4 of the ion beam milling unit 514 may form the second angle θ2 (where θ2=90°−θ1) with respect to the top surface 512a of the stage 512. Accordingly, the focused ion beam emitted from the ion beam milling unit 514 may be incident onto the mold layer 110 at the second angle θ2 with respect to the top surface of the substrate 100, and the mold layer 110 on the substrate 100 may be diagonally cut or milled with respect to the top surface of the substrate 100. When viewed in a plan view, the FIB milling may be performed along an extending direction of the mold openings 121. For example, the FIB milling may be performed along a direction antiparallel to the first direction D1, when viewed in a plan view.

As a result of the diagonal milling, the cutting surface 131 of the mold layer 110 may have a first edge 131a, which may correspond to a starting point of the FIB milling and may be called "Top", and a second edge 131b, which may correspond to an end point of the FIB milling and may be called "Bottom". The first edge 131a of the cutting surface 131 may be positioned adjacent to the top surface of the mold layer 110, and the second edge 131b of the cutting surface 131 may be positioned adjacent to the top surface of the substrate 100. In other words, the cutting surface 131 may be a downwardly inclined surface extending from the top surface of the mold layer 110 toward the top surface of the substrate 100. The cutting surface 131 may be formed to expose the mold openings (hereinafter, referred to as "milling openings 126"). The milling openings 126 may have a monotonically decreasing height in a direction from the first edge 131a toward the second edge 131b.

Referring to FIGS. 1 through 3, 17, and 18A, image data (e.g., a SEM image) of the cutting surface 131 may be obtained by irradiating an electron beam on the cutting surface 131. The image data may include contour images of the milling openings 126 exposed by the cutting surface 131 (S30). In example embodiments, an electron beam "eb1" may be irradiated on the cutting surface 131 in a direction normal to the top surface of the substrate 100. The image data obtained in this manner may be referred to as "a plane projection image" of the cutting surface 131. In other example embodiments, an electron beam "eb2" may be irradiated in a direction normal to the cutting surface 131. In this case, the image data may be measured along a profile of the cutting surface 131. In the present embodiment, the low-magnification image of FIG. 18A may be a single low-magnification image of a portion (e.g., a field of view) of the cutting surface 131 and may be obtained by irradiating the electron beam on the cutting surface 131 in the direction normal to the top surface of the substrate 100. As shown in FIG. 18A, the contour images of the milling openings 126 (hereinafter, trench contour images 129) may be taken to include a pair of line patterns, which are spaced apart from each other in the x direction, i.e., along direction D2, and extend in the y direction, i.e., along direction D1. The trench contour images 129 may have a width corresponding to the width Wa of the milling openings 126. Although not illustrated, the width Wa of the trench contour images 129 may not be uniform. In other words, the width Wa of the trench contour images 129 may be changed depending on a position in the y direction.

The obtained image data of the cutting surface 131 may be transferred to the computer system 520. Thereafter, the contour images of the milling openings 126 may be processed to obtain process parameters representing information on a three-dimensional structure of the mold openings 121 (S40). The process parameters may be calculated by the controller 522 of the computer system 520, based on a previously-developed algorithm.

In detail, center lines cl of the trench contour images 129 may be obtained from the low-magnification image of the cutting surface. Unlike that illustrated in FIG. 18A, the center lines cl may not have a linear shape. In other words, the width Wa of the trench contour images 129 may be changed depending on the position in the y direction, and the center line cl may be changed in a same or similar manner. Thereafter, if a Cartesian coordinate system is used, x-y coordinates of specific points 129s on the center line cl may be examined. The specific points 129s on the center line cl may be spaced apart from each other by a predetermined space in the y direction. One of the specific points 129s on the center line cl may be selected as a reference point (or a first point 129s1). Thereafter, a process parameter representing an extent of the bending of the mold openings 121 according to a change in height may be obtained by calculating differences in x coordinate between the reference point and other points (i.e., relative positions of the specific points 129s of the center line cl in the x direction) and parameterizing the calculated x-coordinate differences (e.g., through a numerical representation using dispersion or standard deviation of the calculated differences in the x coordinates). As an example, the process parameter may be obtained from each or all of the milling openings 126. Here, the relative positions of the specific points 129s of the center line cl in the x direction may be shown using a distribution chart, in which heights of the milling openings 126 associated therewith are plotted. FIG. 18B is a graph showing an example of such a distribution. The distribution chart may be used as a criterion for qualitatively evaluating the extent of bending of the mold openings 121 according to a change in height.

The following provides an example of a method of fabricating a semiconductor device using an inspection method according to example embodiments.

Figure 19:
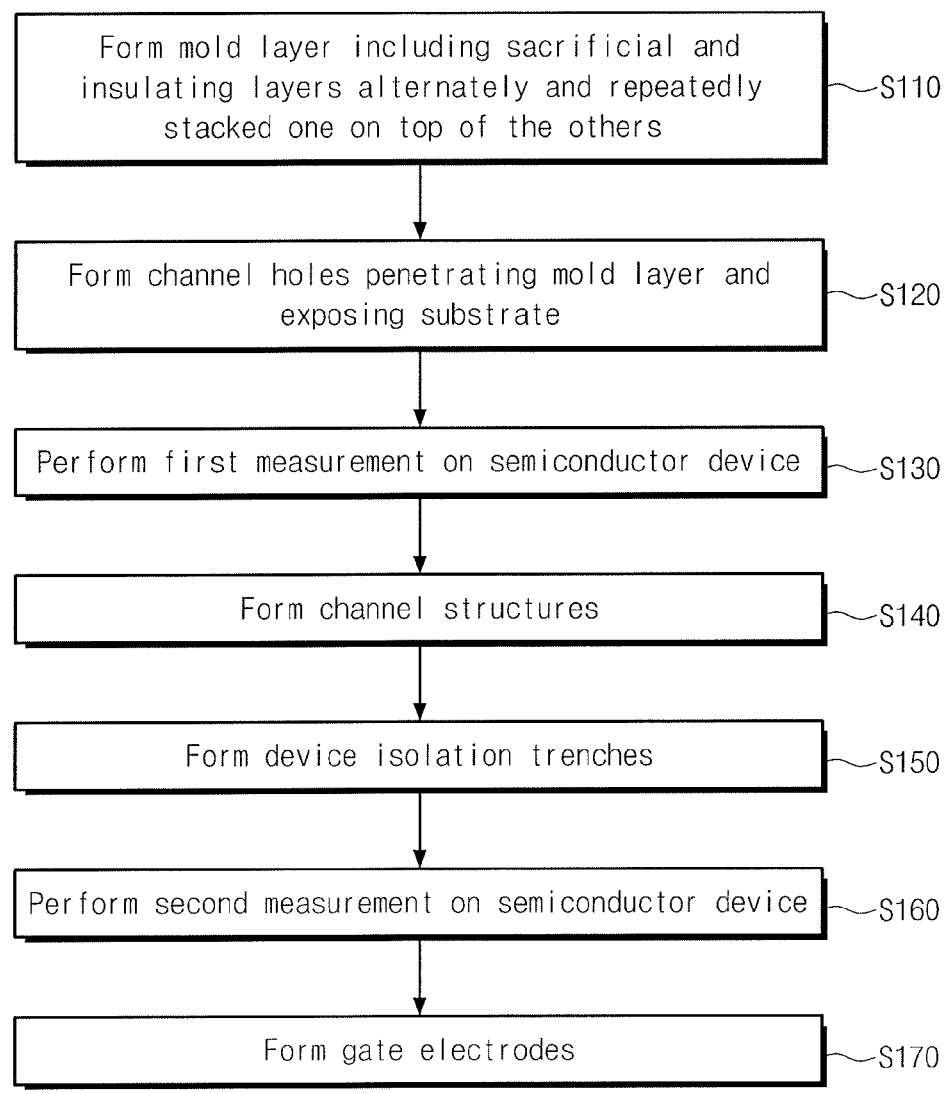
FIG. 19 illustrates a flow chart of a method of fabricating a semiconductor device using an inspection method according to example embodiments.
Figure 20:
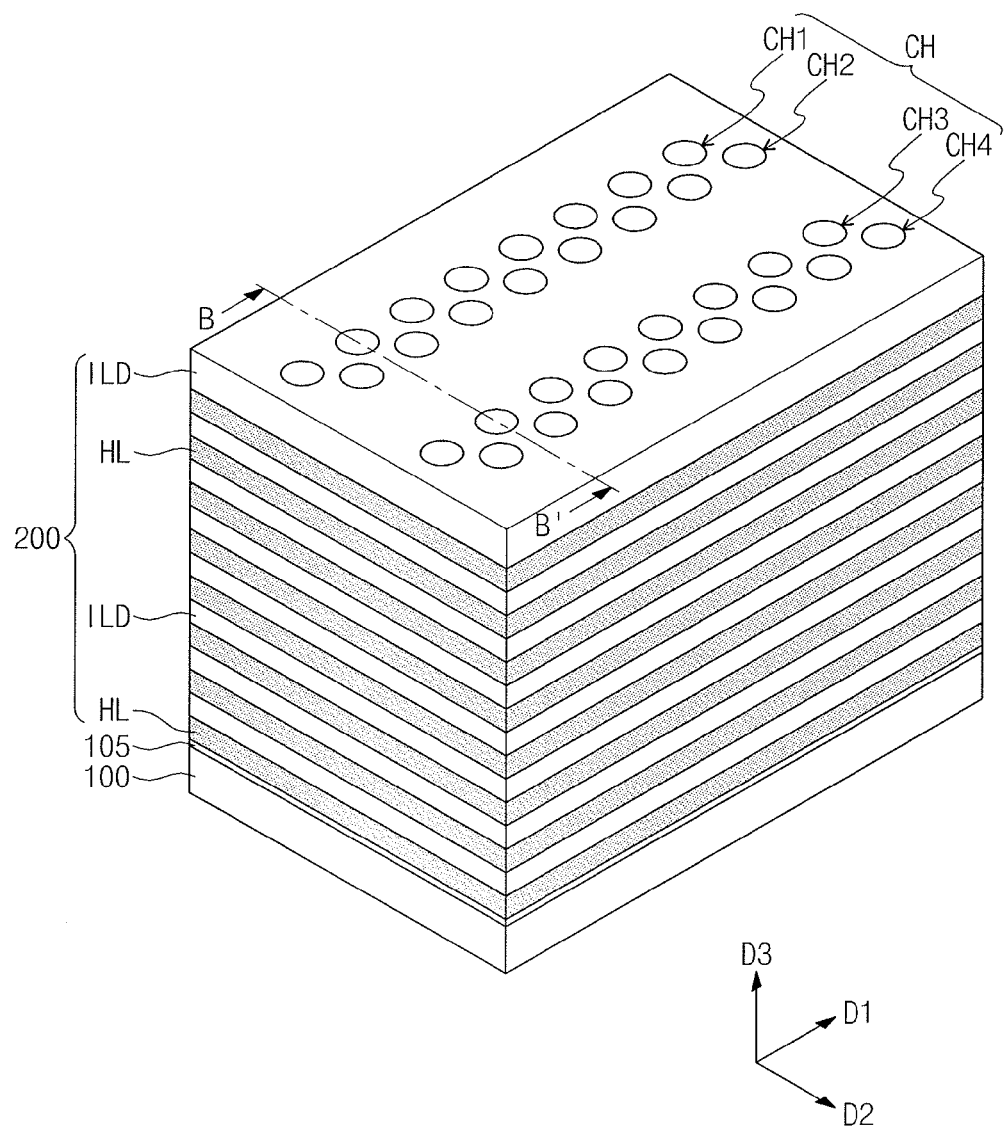
FIG. 20 illustrates a perspective view of a method of fabricating a semiconductor device using an inspection method according to example embodiments.
Figure 22:
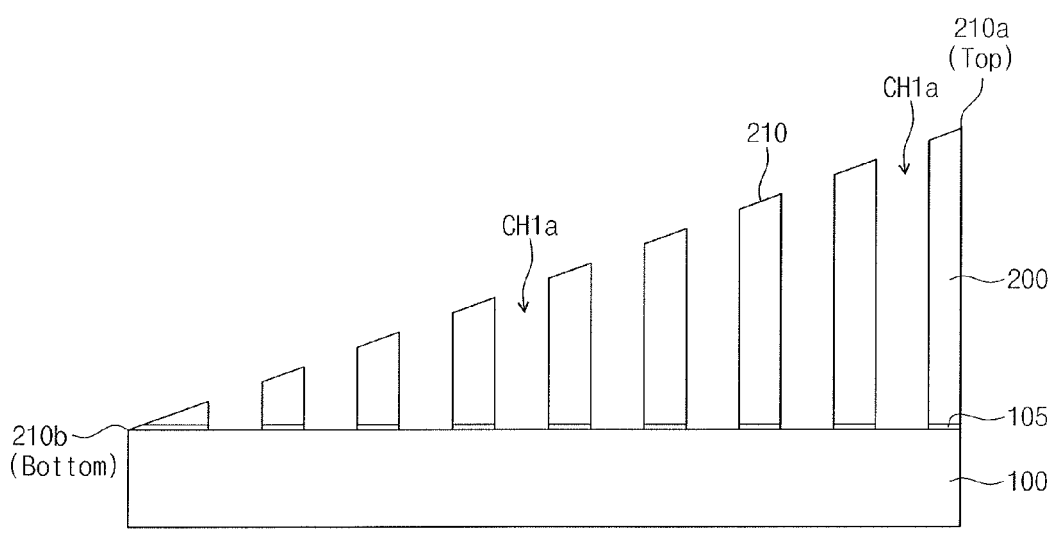
FIG. 22 illustrates a sectional view of a vertical section of a semiconductor device, after an FIB milling process.
Figure 23:
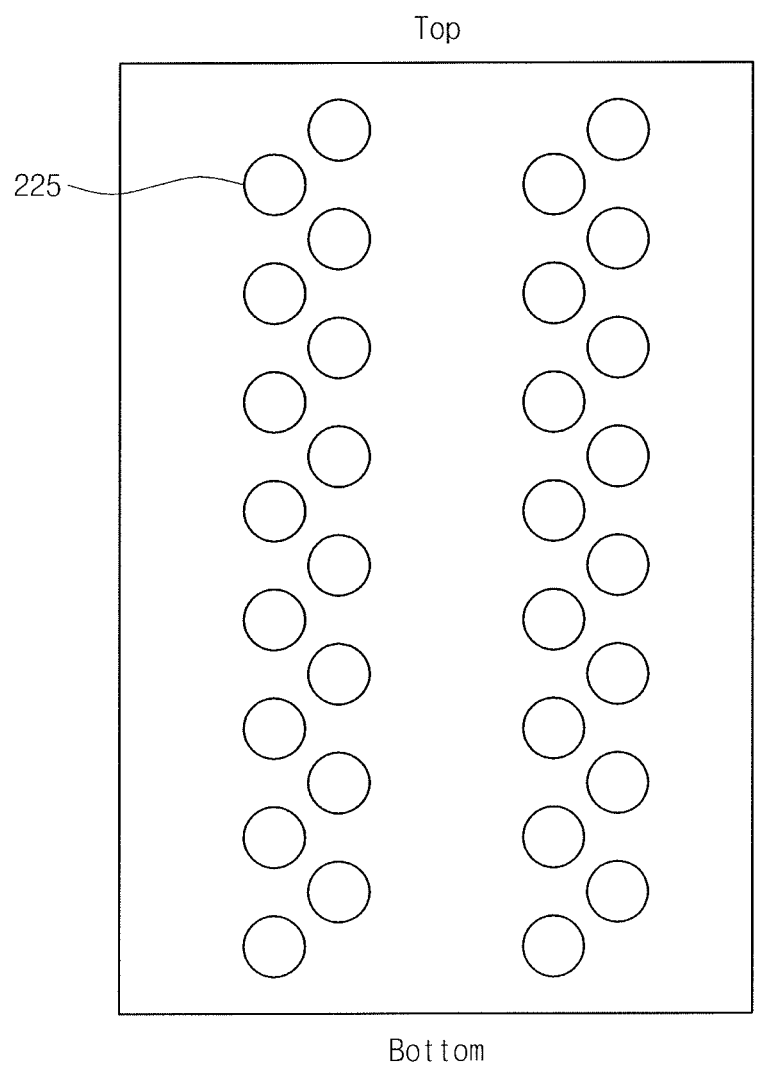
FIGS. 23 and 26 illustrate diagrams of image data obtained from first and second cutting surfaces, respectively.

FIG. 19 is a flow chart illustrating a method of fabricating a semiconductor device using an inspection method according to example embodiments. FIG. 20 is a perspective view illustrating a method of fabricating a semiconductor device using an inspection method according to example embodiments. FIGS. 21, 24, 25, and 27 are sectional views taken along line B-B' of FIG. 20. FIG. 22 is a sectional view exemplarily illustrating a vertical section of a semiconductor device, after an FIB milling process. FIGS. 23 and 26 are diagrams provided to exemplarily illustrate image data obtained on first cutting surfaces.

Figure 21:
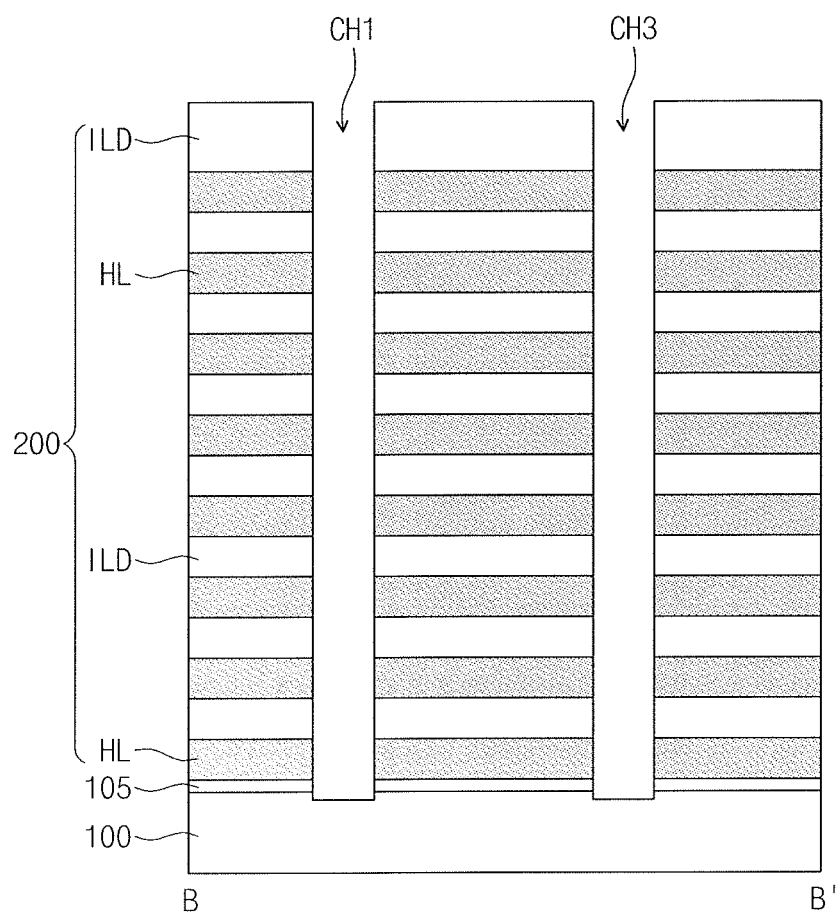
FIGS. 21, 24, 25, and 27 illustrate sectional views along line B-B' of FIG. 20.

Referring to FIGS. 19, 20, and 21, a mold layer 200 may be formed on the substrate 100 (S110). The mold layer 200 may include sacrificial layers HL and insulating layers ILD, which are alternately and repeatedly stacked on the substrate 100. The sacrificial layers HL may be formed of a material, which can be selectively etched with a higher etch rate than that of the insulating layers ILD. In example embodiments, the sacrificial layers HL and the insulating layers ILD may be formed in such a way that they are etched to have a high etch selectivity in a wet etching process using chemical solution and a low etch selectivity in a dry etching process using etching gas. In example embodiments, the sacrificial layers HL may be formed to have substantially the same thickness. However, in other example embodiments, the uppermost and lowermost ones of the sacrificial layers HL may be formed to be thicker than the others. The insulating layers ILD may be formed to have substantially the same thickness, but in other example embodiments, at least one (e.g., the uppermost one) of the insulating layers ILD may have a different thickness than the others.

In example embodiments, the sacrificial layers HL and the insulating layers ILD may be formed of insulating materials having different etch rates to a specific etchant. For example, the sacrificial layers HL may be at least one of a silicon layer, a silicon oxide layer, a silicon carbide layer, a silicon oxynitride layer, or a silicon nitride layer. The insulating layers ILD may be at least one of a silicon layer, a silicon oxide layer, a silicon carbide layer, a silicon oxynitride layer, or a silicon nitride layer, but it may be formed of a material selected to be different from the sacrificial layer HL. For example, the sacrificial layers HL may be formed of a silicon nitride layer, while the insulating layers ILD may be formed of a silicon oxide layer. In other embodiments, the sacrificial layers HL may be formed of a conductive material, while the insulating layers ILD may be formed of an insulating material. Furthermore, a lower insulating layer 105 may be formed between the substrate 100 and the mold layer 200. For example, the lower insulating layer 105 may be or include a silicon oxide layer, which may be formed by a thermal oxidation process. Alternatively, the lower insulating layer 105 may be or include a silicon oxide layer, which may be formed by a deposition process. The lower insulating layer 105 may be formed to be thinner than the sacrificial layers HL and the insulating layers ILD provided thereon.

A plurality of channel holes CH may be formed through the mold layer 200 to expose the substrate 100 (S120). The plurality of channel holes CH may be two-dimensionally arranged, when viewed in plan view. In other words, the plurality of channel holes CH may be arranged to form a plurality of rows parallel to the first direction D1 and a plurality of columns parallel to the second direction D2 crossing the first direction D1. As an example, the channel holes CH may include first channel holes CH1, which are arranged in the first direction D1 to form a first column, and second channel holes CH2, which are arranged in the first direction D1 to form a second column spaced apart from the first channel holes CH1 in the second direction D2. Here, the first and second channel holes CH1 and CH2 may be arranged in a zigzag manner along the first direction D1. The channel holes CH may further include third and fourth channel holes CH3 and CH4, which are formed to have substantially the same arrangement as the first and second channel holes CH1 and CH2, respectively. The third and fourth channel holes CH3 and CH4 may be formed spaced apart from the first and second channel holes CH1 and CH2 in the second direction D2.

In example embodiments, the formation of the channel holes CH may include forming mask patterns (not shown) on the mold layer 200 and performing a first etching process using them as an etch mask. The top surface of the substrate 100 may be over-etched during the first etching process. In other words, the top surface of the substrate 100 may be partially recessed. The channel holes CH may be formed to have a high aspect ratio. As an example, the channel holes CH may have a high aspect ratio ranging from about 1:5 to about 1:100. Such a high aspect ratio of the channel holes CH may lead to a difficulty in uniformly controlling a process dispersion of the first etching process for forming the same. An increase in process dispersion of the first etching process may result in pattern failures (such as, deflection, striation, bowing, or distortion) associated with the channel holes CH. Accordingly, after the first etching process, measurements to monitor process parameters of the first etching process may be taken.

A first measurement may be performed on a semiconductor device using, for example, the semiconductor inspection system 500 described with reference to FIGS. 1 and 2 (S130). The substrate 100 may be a wafer with a plurality of chip regions, and the first measurement may be performed on inspection regions provided in the chip regions, respectively. As an example, the inspection regions may include dummy patterns, which are formed to have substantially the same structure as that of the mold layer 200 with the channel holes CH.

The first measurement may include FIB milling, which may be performed on the substrate 100 provided with the mold layer 200 with the channel holes CH. As described with reference to the operation S20 of FIG. 3, the FIB milling may be performed in a direction, which is inclined, by a specific angle, with respect to a direction normal to the top surface of the substrate 100. As a result, as shown in FIG. 22, the mold layer 200 may have a first cutting surface 210, which is at an oblique angle (i.e., inclined) with respect to the top surface of the substrate 100. The first cutting surface 210 may be formed to expose the milled channel holes. As an example, the first cutting surface 210 may expose the first channel holes CH1a, to which the FIB milling is applied, and here, the first milling channel holes CH1a constituting each column may have different heights from each other. In other words, the column of the first milling channel holes CH1a may be parallel to in a direction from a first edge 210a (or "top") of the first cutting surface 210, which is adjacent to the top surface of the mold layer 200, to a second edge 210b (or "bottom") of the first cutting surface 210, which is opposite to the first edge 210a and adjacent to the top surface of the substrate 100.

Thereafter, imaging (for example, using a SEM system) may be performed on the first cutting surface 210 of the mold layer 200 to obtain image data of the first cutting surface 210. Obtaining the image data of the first cutting surface 210 may be performed in the same manner as that of operation S30 of FIG. 3. FIG. 23 shows an example of the image data of the first cutting surface 210, which is obtained by imaging a portion (e.g., a field of view) of the first cutting surface 210 at a time at low magnification. The low-magnification image of the first cutting surface 210 may be taken to include channel hole contour images 225 (i.e., contour images of the milled channel holes). Although not shown, the image data of the first cutting surface 210 may include a plurality of high-magnification images, which are obtained by imaging respective portions of the first cutting surface 210 several times at high magnification. The plurality of high-magnification images may be taken to include contour images spanning the whole area of the milled channel holes exposed by the first cutting surface 210. The contour images of the milled channel holes may be used to obtain process parameters representing information on a three-dimensional structure of the channel holes CH according to a change in height. In other words, it is possible to obtain process parameters representing extents of bending, striation, bowing, and distortion of the channel holes CH according to a change in height. The obtaining of the process parameters may be performed in the same manner as that described with reference to FIGS. 8 through 13.

According to example embodiments, the first etching process may be controlled using the process parameters representing extents of bending, striation, bowing, and distortion of the channel holes CH. In other words, by analyzing differences between the obtained values and desired values of the process parameters, it is possible to obtain an optimized process condition or recipe for the first etching process (i.e., to obtain desired values). For example, the first etching process may be optimized by adjusting at least one (e.g., etching time, an amount of etchant, or a kind of etchant) of the obtained process conditions. In example embodiments, the process condition of the first etching process may be controlled using an APC system (not shown). For example, to determine the optimized process condition for obtaining desired process parameters, an APC server (not shown) with the APC system (not shown) may be configured to compare process parameters of the channel holes CH with process condition data of the first etching process and use a previously-designed APC logic. By performing the first etching process using the optimized process condition obtained by the above method, it is possible to improve a process dispersion of the first etching process. In other words, in the case where the inspection method according to example embodiments is used for a first measurement, it is possible to improve the process dispersion of the first etching process and consequently to improve reliability of the semiconductor device.

Figure 24:
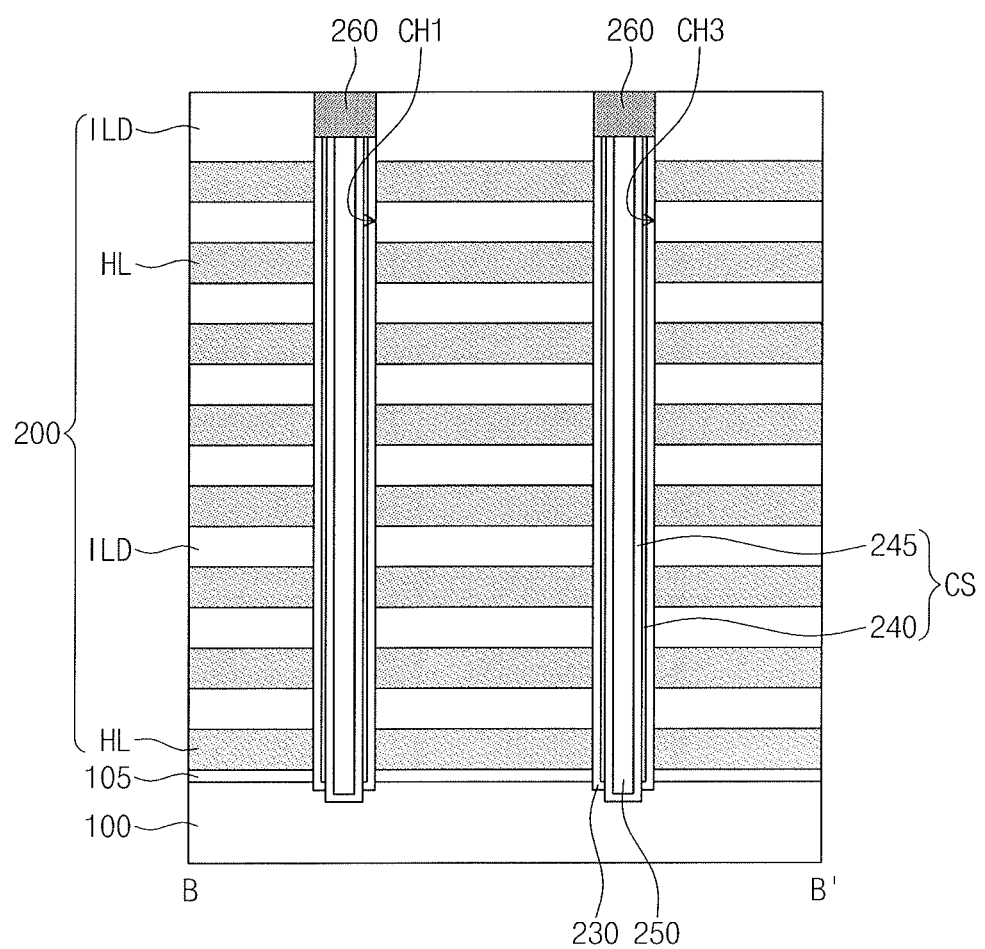

Referring to FIGS. 19, 20, and 24, channel structures CS with first semiconductor patterns 240 and second semiconductor patterns 245 may be formed in the channel holes CH (S140).

In detail, vertical insulating patterns 230 and the first semiconductor patterns 240 may be formed in the channel holes CH. In example embodiments, the formation of the vertical insulating patterns 230 and the first semiconductor patterns 240 may include sequentially forming a vertical insulating layer and a first semiconductor layer to cover inner surfaces of the channel holes CH and anisotropically etching the first semiconductor layer and the vertical insulating layer to expose the substrate 100. The vertical insulating patterns 230 and the first semiconductor patterns 240 may be formed to have a hollow cylindrical shape. The vertical insulating layer may include a plurality of thin films, which may be formed by, e.g., one of physical chemical vapor deposition (CVD), one of plasma enhanced (PE) CVD, and atomic layer deposition (ALD) processes.

The vertical insulating layer may include a charge storing layer, which may serve as a memory element of FLASH memory devices. The charge storing layer may be a trap insulating layer or an insulating layer with conductive nanodots. In certain embodiments, the vertical insulating layer may include at least one layer (not shown) exhibiting a phase-changeable or variable resistance property.

In example embodiments, the vertical insulating layer may include a blocking insulating layer, a charge storing layer, and a tunnel insulating layer, which are sequentially stacked on the inner surfaces of the channel holes CH. The blocking insulating layer may be formed to cover sidewalls of the sacrificial layers HL and the insulating layers ILD exposed by the channel holes CH and the top surface of the substrate 100. The blocking insulating layer may include at least one of silicon oxide or high-k dielectrics. The charge storing layer may include a trap insulating layer or an insulating layer with conductive nano dots. For example, the charge storing layer may include at least one of a silicon nitride layer, a silicon oxynitride layer, a silicon-rich nitride layer, a nanocrystalline silicon layer, or a laminated trap layer. The tunnel insulating layer may be formed of at least one of insulating layers, whose band gaps are greater than that of the charge storing layer. For example, the tunnel insulating layer may be a silicon oxide layer.

The first semiconductor layer may be formed on the vertical insulating layer. In example embodiments, the first semiconductor layer may be formed of a semiconductor material (e.g., poly silicon, single crystalline silicon, or amorphous silicon), which may be formed using one of ALD and CVD techniques. The top surface of the substrate 100 may be over-etched or recessed, during anisotropically etching the first semiconductor layer and the vertical insulating layer.

The second semiconductor patterns 245 and gap-filling insulating patterns 250 may be formed in the channel holes CH. In example embodiments, the formation of the second semiconductor patterns 245 and the gap-filling insulating patterns 250 may include sequentially forming a second semiconductor layer and an insulating filling layer in the channel holes CH and planarizing the second semiconductor layer and the insulating filling layer to expose the top surface of the mold layer 200. The second semiconductor layer may be conformally formed to have enough thickness to prevent the channel holes CH from being filled with the second semiconductor layer. The second semiconductor layer may be a semiconductor layer (e.g., a polysilicon layer, a single-crystalline silicon layer, or an amorphous silicon layer), which may be formed by one of an ALD or a CVD. The insulating filling layer may be formed to completely fill the channel holes CH. As an example, the insulating filling layer may be one of insulating layers and a silicon oxide layer, which may be formed using a spin-on-glass (SOG) technique.

Next, conductive pads 260 may be formed to be in contact with the first semiconductor patterns 240 and the second semiconductor patterns 245. The formation of the conductive pads 260 may include recessing upper portions of the first and second semiconductor patterns 240 and 245 and filling the recessed regions with a conductive material. Also, the conductive pads 260 may have a conductivity type different from the first and second semiconductor patterns 240 and 245 by, for example, doping the first and second semiconductor patterns 240 and 245 with impurities. Although not illustrated, the conductive pads 260 may be formed after forming a device isolation pattern 290, which will be described with reference to FIG. 27.

Figure 25:
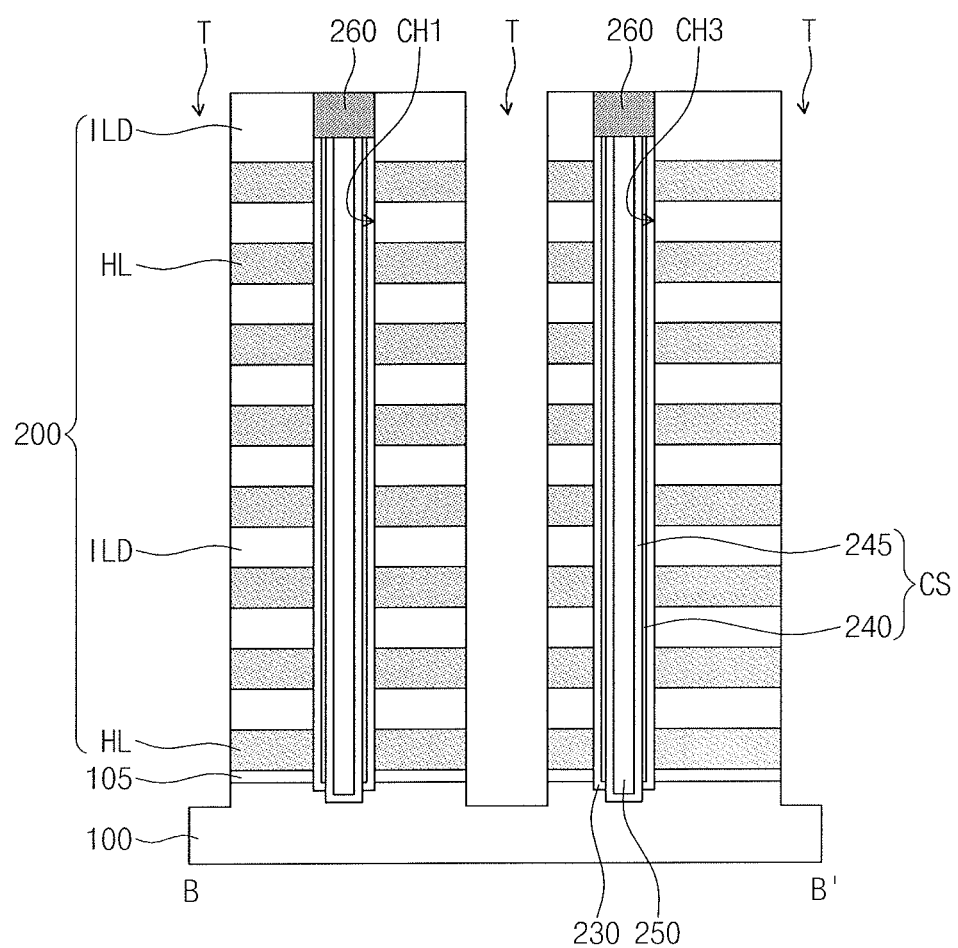
Figure 26:
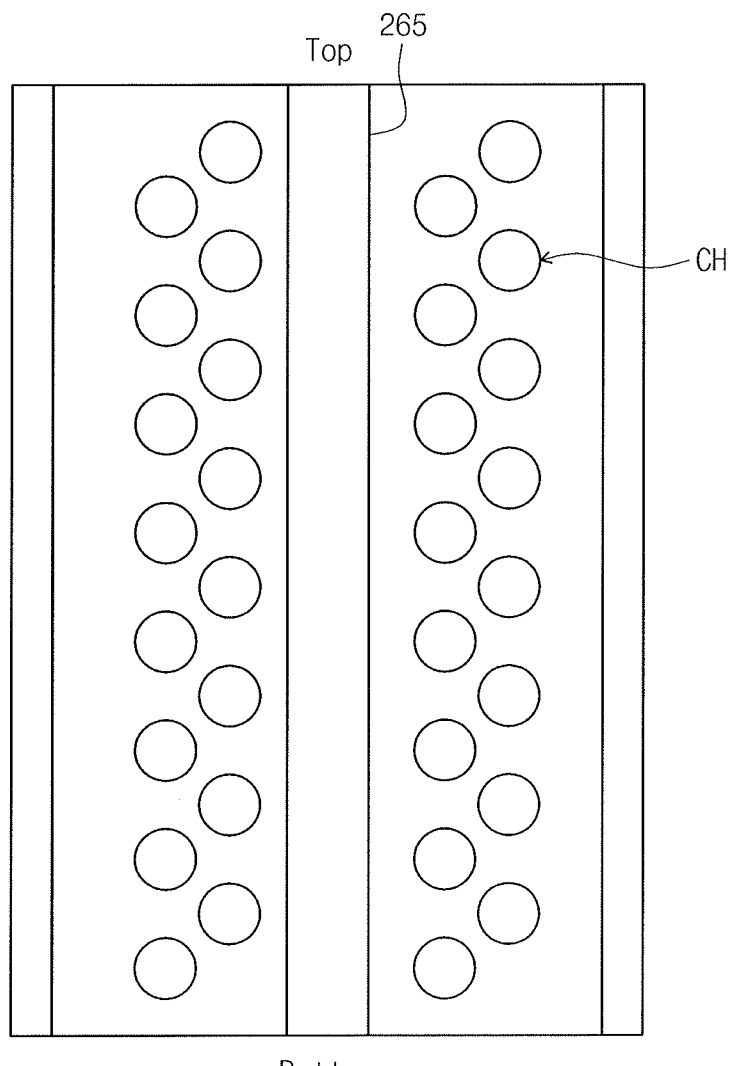

Referring to FIGS. 19, 20, and 25, the mold layer 200 may be patterned to form device isolation trenches T exposing the substrate 100 (S150). The device isolation trenches T may be formed spaced apart from the channel holes CH. In the present embodiment, the device isolation trenches T may be formed at a side of the first channel holes CH1, between the second and third channel holes CH2 and CH3, and at a side of the fourth channel holes CH4.

The formation of the device isolation trenches T may include forming mask patterns (not shown) on the mold layer 200 and performing a second etching process using them as an etch mask. The device isolation trenches T may be formed to expose sidewalls of the sacrificial and insulating layers HL and ILD. Each of the device isolation trenches T may be a line-shaped structure extending parallel to the first direction D1 in a plan view and may be formed to expose the top surface of the substrate 100 in a vertical view. Further, even though the anisotropic etching process is used, the device isolation trenches T may be formed to have a varying width in a direction away from the substrate 100.

A second measurement may be performed on a semiconductor device using, for example, the semiconductor inspection system 500 described with reference to FIGS. 1 and 2 (S160). In example embodiments, the second measurement may be performed on the remaining inspection regions of the wafer, to which the first measurement is not performed. As an example, the inspection regions for the second measurement may include dummy patterns, which are formed to have substantially the same structure as that of the mold layer 200 with the device isolation trenches T.

The second measurement may be performed in substantially the same manner as the first measurement. For example, a FIB milling may be performed on the resulting structure with the device isolation trenches T in a diagonal direction to form an inclined second cutting surface in the mold layer 200, and then, the image data of the second cutting surface may be obtained. FIG. 26 shows an example of the image data of the second cutting surface, which is obtained by imaging a portion (e.g., a field of view) of the second cutting surface at a time at low magnification. The low-magnification image of the second cutting surface may be taken to include trench contour images 265 (i.e., contour images of the device isolation trenches T). The contour images of the device isolation trenches T may be used to obtain a process parameter representing an extent of bending of the trenches according to a change in height. According to example embodiments, as described above, the process condition of the second etching process may be controlled based on the process parameter associated with the bending of the device isolation trenches T. The controlling of the process condition of the second etching process may be performed in the same or similar manner as the method of controlling the process condition in the first etching process. In conclusion, in the case where the inspection method according to example embodiments is used for the second measurement, it is possible to improve the process dispersion of the second etching process and consequently to improve reliability of the semiconductor device.

Figure 27:
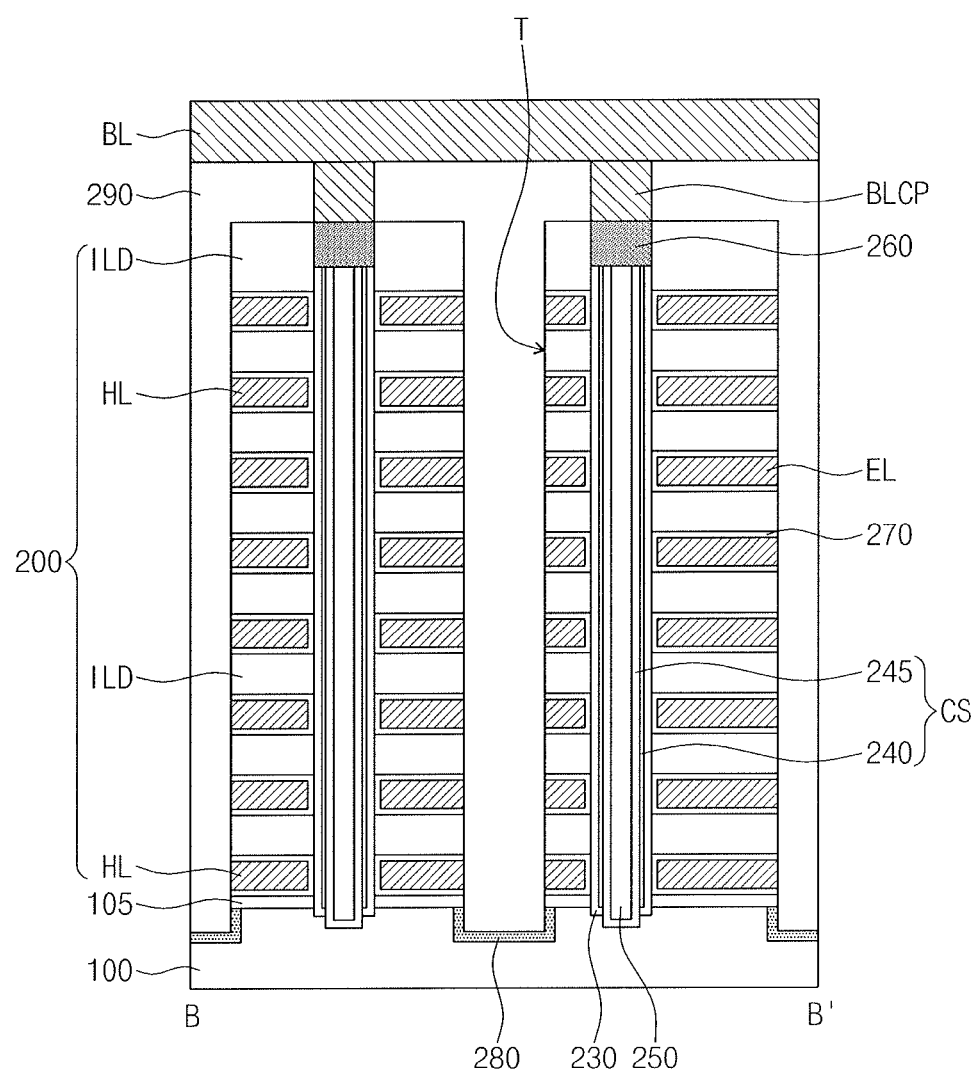

Referring to FIG. 27, the sacrificial layers HL may be replaced with gate electrodes EL. In other words, the sacrificial layers HL exposed by the device isolation trenches T may be selectively removed to form recess regions, and the gate electrodes EL may be formed in the recess regions (S170). The recess regions may be gap regions laterally extending from the device isolation trenches T. The recess regions may be formed between the insulating layers ILD to expose sidewalls of the vertical insulating patterns 230. In example embodiments, before the formation of the gate electrodes EL, horizontal insulating patterns 270 may be formed to partially fill the recess regions. The horizontal insulating patterns 270 may be formed to cover inner surfaces of the recess regions.

In example embodiments, formation the horizontal insulating patterns 270 and the gate electrodes EL may include sequentially forming a horizontal layer and a gate layer (e.g., a metal layer) to fill the recess regions and removing the horizontal layer and the gate layer from the device isolation trenches T. Each of the horizontal insulating patterns 270 may be formed to have a single- or multi-layered structure, similar to the vertical insulating patterns 230. In example embodiments, the horizontal insulating patterns 270 may include a blocking dielectric layer of a charge-trap type nonvolatile memory transistor.

After the formation of the gate electrodes EL, common source regions 280 may be formed in the substrate 100. The common source regions 280 may be formed, in the substrate 100 exposed by the device isolation trenches T, by an ion implantation process. Thereafter, a device isolation pattern 290 may be formed on the common source regions 280 to fill the device isolation trenches T. The device isolation pattern 290 may be formed of at least one of a silicon oxide layer, a silicon nitride layer, or a silicon oxynitride layer.

Thereafter, contact plugs BLCP may be formed to be connected to the conductive pads 260, and a bit line BL may be formed to be connected to the contact plugs BLCP. The bit line BL may be electrically connected to the first semiconductor patterns 240 and the second semiconductor patterns 245 via the contact plugs BLCP.

Figure 28:
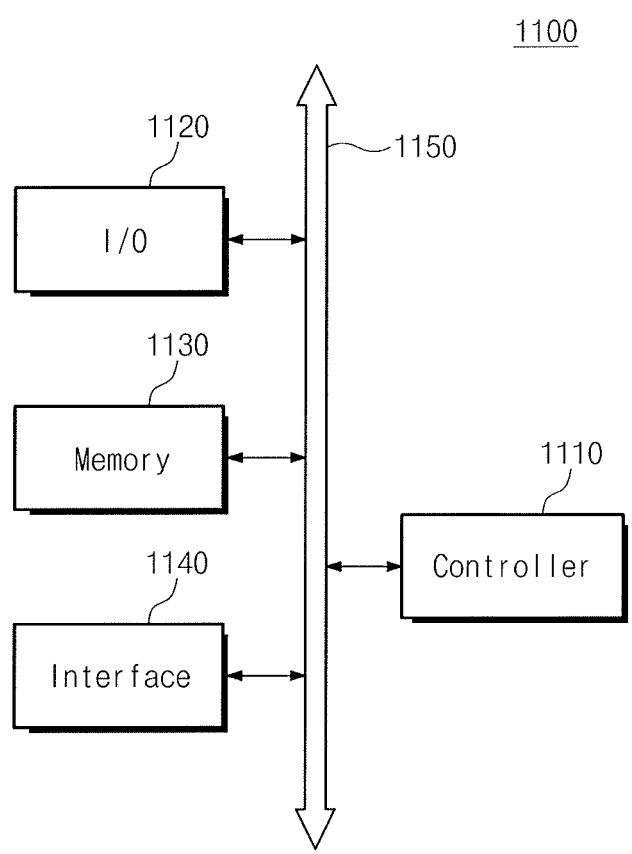
FIG. 28 illustrates a schematic block diagram of a memory system including a semiconductor device according to example embodiments.

FIG. 28 is a schematic block diagram illustrating an example of a memory system including a semiconductor device according to example embodiments.

Referring to FIG. 28, a memory system 1100 can be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a display device, a memory device 1130, an interface 1140, and a bus 1150. The memory device 1130 and the interface 1140 communicate with each other through the bus 1150.

The controller 1110 includes at least one microprocessor, at least one digital signal processor, at least one micro controller, or other similar processors. The memory device 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory device 1130 may include a semiconductor device according to example embodiments. The memory 1130 may further include a randomly accessible volatile memory or any other type memory device. The interface 1140 may be configured to receive or output data or signals from or to a communication network.

Figure 29:
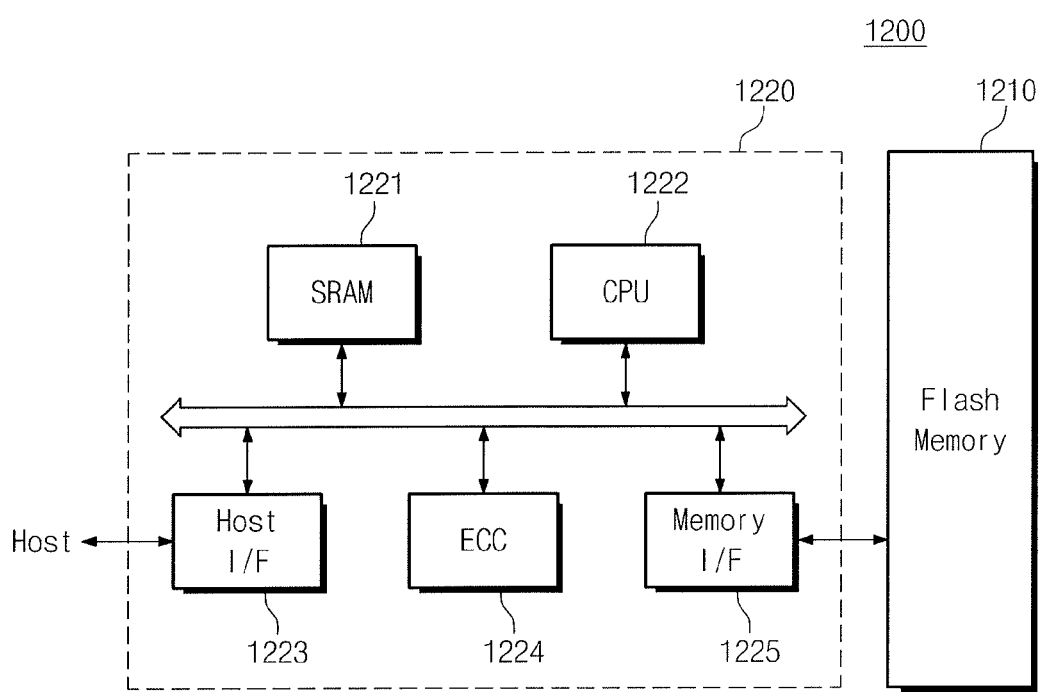
FIG. 29 illustrates a schematic block diagram of a memory card including a semiconductor device according to example embodiments.

FIG. 29 is a schematic block diagram illustrating an example of a memory card including a semiconductor device according to example embodiments.

Referring to FIG. 29, a memory card 1200 may be configured to include a semiconductor memory device 1210 with a large memory capacity. The memory device 1210 may include at least one of semiconductor devices according to the afore-described embodiments. The memory card 1200 includes a memory controller 1220 configured to control a data exchange operation between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. Even though not depicted in drawings, it is apparent to one of ordinary skill in the art that the memory card 1200 according to example embodiments may further include a read only memory (ROM) storing code data for interfacing with the host.

Figure 30:
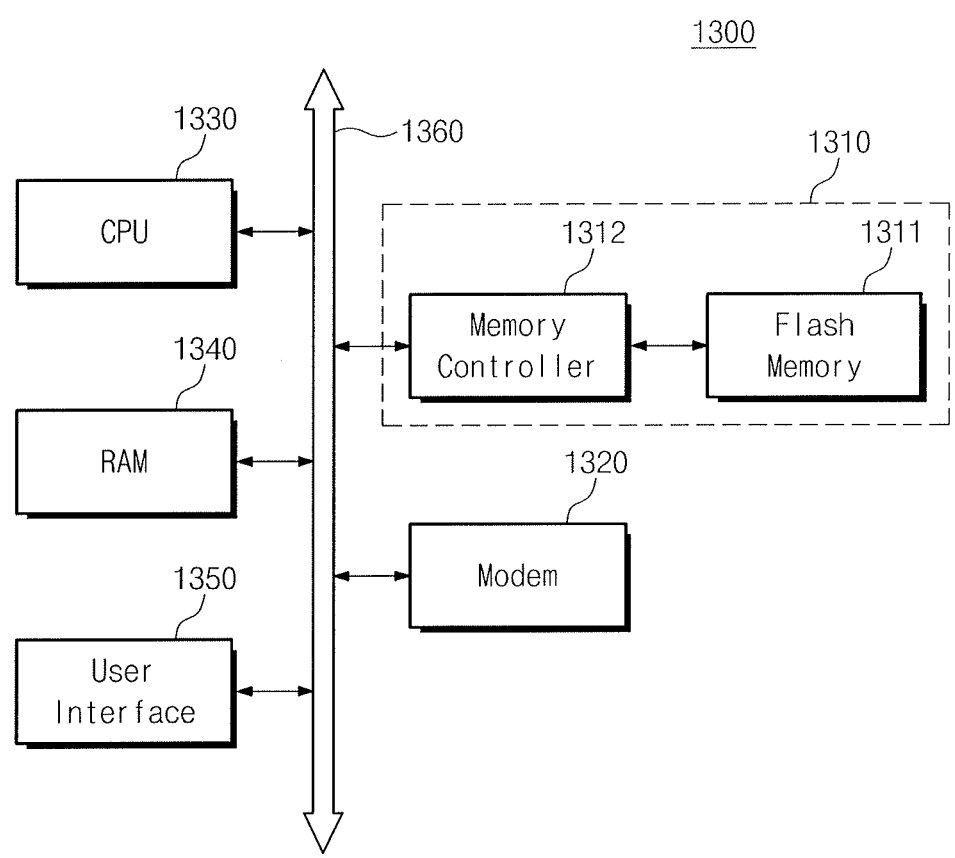
FIG. 30 illustrates a schematic block diagram of an information processing system including a semiconductor device according to example embodiments.

FIG. 30 is a schematic block diagram illustrating an example of an information processing system including a semiconductor device according to example embodiments.

Referring to FIG. 30, an information processing system 1300 may include a memory system 1310, such as a mobile device and/or a desktop computer mobile. The memory system 1310 may include at least one of semiconductor devices according to the afore-described embodiments. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system or the memory card described with reference to FIG. 28 or 29. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the example embodiments.

According to example embodiments, an inspection method of a semiconductor device may include milling a mold layer with a plurality of mold openings in a diagonal direction to form an downwardly inclined cutting surface. Thereafter, image data may be obtained to contain contour images of the milling openings exposed by the cutting surface. The contour images of the milling openings may contain structural information on three-dimensional sections of the mold openings. Accordingly, by analyzing the contour images of the milling openings, it is possible to obtain process parameters associated with the three-dimensional structure of the mold openings. In conclusion, even when the milling process is only performed once, it is possible to effectively obtain process monitoring data on a process (e.g., an etching process) for forming the mold openings.

The process monitoring data obtained by this method may be utilized to optimize process conditions in a process of fabricating a semiconductor device, and this makes it possible to fabricate a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of inspecting a semiconductor device, the method comprising:

providing a substrate, on which a mold layer with a plurality of mold openings is provided;

milling the mold layer in a direction inclined at a predetermined angle with respect to a direction normal to a top surface of the substrate, such that an inclined cutting surface exposing milled mold openings is formed, the milled mold openings including first milling openings along a first column extending in a first direction and having different heights;

obtaining image data of the inclined cutting surface, the image data including first contour images of the first milling openings; and obtaining a first process parameter, which represents an extent of bending of the mold openings according to a distance from a top surface of the substrate, using positions of center points of the first contour images.

2. The method as claimed in claim 1, wherein obtaining the first process parameter includes:

obtaining positions of the center points of the first contour images;

establishing one of the first contour images as a reference contour image; and obtaining relative position values between the center points of the reference contour image and the first contour images.

3. The method as claimed in claim 2, wherein:

obtaining the relative position values between the center points includes obtaining differences between x coordinates of the center points of the reference contour image and the first contour images in an x-y coordinate system, and the first process parameter is obtained by using the differences.

4. The method as claimed in claim 1, wherein:

the milled mold openings further comprise second milling openings along a second column extending in the first direction and having different heights, the image data comprises includes second contour images of the second milling openings, and obtaining the first process parameter further comprises using positions of center points of the second contour images.

5. The method as claimed in claim 4, wherein:

the cutting surface includes a first edge and a second edge, which are opposite to and spaced laterally apart from each other and are adjacent to top and bottom surfaces, respectively, of the mold layer, and the first direction is directed from the first edge to the second edge, when viewed in plan view.

6. The method as claimed in claim 5, wherein the second milling openings are spaced apart from the first milling openings in a second direction crossing the first direction, the first and second milling openings being arranged in a zigzag manner in the first direction, when viewed in plan view.

7. The method as claimed in claim 1, further comprising obtaining a second process parameter, which represents dispersion in section shapes of the mold openings according to the distance from the top surface of the substrate, using contour lines of the first contour images.

8. The method as claimed in claim 7, wherein obtaining the second process parameter includes obtaining at least one of:

a first sub process parameter representing an extent of striation of the mold openings according to heights of the mold openings, a second sub process parameter representing an extent of bowing of the mold openings according to heights of the mold openings, or a third sub process parameter representing an extent of distortion of the mold openings according to heights of the mold openings.

9. The method as claimed in claim 8, wherein obtaining the second process parameter includes obtaining the first sub process parameter, obtaining the first sub process parameter including:

specifying a contour line of each of the first contour images;

obtaining a comparative line from the contour line of each of the first contour images; and obtaining differences between the contour and comparative lines of each of the first contour images.

10. The method as claimed in claim 9, wherein the comparative line is obtained by an ellipse fitting method.

11. The method as claimed in claim 8, wherein obtaining the second process parameter includes obtaining the second sub process parameter, obtaining the second sub process parameter including:

specifying a contour line of each of the first contour images;

obtaining a comparative line from the contour line of each of the first contour images; and obtaining a longitudinal or traversal length of the comparative line of each of the first contour images.

12. The method as claimed in claim 11, wherein obtaining the third sub process parameter includes calculating a difference or ratio between the longitudinal and traversal lengths.

13. The method as claimed in claim 1, wherein the mold layer is a layer stack including first and second layers, which are alternately and repeatedly stacked one on top of the other and are formed of materials with an etch selectivity with respect to each other.

14. The method as claimed in claim 1, wherein the mold openings are formed to have an aspect ratio ranging from about 1:5 to about 1:100.

15. A method of fabricating a semiconductor device, the method comprising:

forming a mold layer on a substrate, the mold layer including sacrificial layers and insulating layers alternately and repeatedly stacked one on top of the other;

forming a plurality of channel holes to penetrate the mold layer and expose the substrate;

performing a first measurement on a resulting structure with the channel holes;

forming channel structures in the channel holes;

forming trenches to penetrate the mold layer and expose the sacrificial layers and insulating layers, the trenches being formed spaced apart from the channel structures; and replacing the sacrificial layers with gate electrodes, wherein the first measurement includes:

milling a portion of the mold layer in a direction inclined at a predetermined angle with respect to a direction normal to a top surface of the substrate, such that an inclined cutting surface exposing milled channel holes is formed, the milled channel holes including first milling channel holes along a column and having different heights, obtaining image data of the inclined cutting surface, the image data including first contour images of the first milling channel holes, and obtaining process parameters containing information on three-dimensional structures of the channel holes using the first contour images.

16. A method of inspecting a semiconductor device, the method comprising:

providing a substrate, the substrate including a mold layer thereon with a plurality of mold openings spaced apart from each other along a first direction;

milling the mold layer in a direction obliquely inclined with respect to a direction normal to a top surface of the substrate, such that an inclined cutting surface exposing milled mold openings is formed;

obtaining image data of the inclined cutting surface, the image data including first contour images of the milled mold openings; and obtaining a first process parameter using positions of center points of the first contour images, the first process parameter representing an extent of bending of the mold openings according to a distance from a top surface of the substrate.

17. The method as claimed in claim 16, wherein milling the mold layer includes milling an entire top surface of the mold layer including the plurality of mold openings.

18. The method as claimed in claim 17, wherein milling the mold layer includes milling the mold layer such that the plurality of milled mold openings along the first direction have different heights.

19. The method as claimed in claim 18, wherein obtaining the first process parameter includes comparing the positions of center points of the first contour images of the milled mold openings adjacent to each other along the first direction.

20. The method as claimed in claim 16, further comprising comparing a contour line of each of the first contour images to a reference contour line.

* * * * *